(12) United States Patent
Maeda

(10) Patent No.: US 10,468,631 B2
(45) Date of Patent: Nov. 5, 2019

(54) LIGHT-EMITTING WITH ADJUSTMENT LAYERS AND MANUFACTURING METHOD THEREOF

(71) Applicant: Japan Display Inc., Tokyo (JP)

(72) Inventor: Norihisa Maeda, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 15/783,210

(22) Filed: Oct. 13, 2017

(65) Prior Publication Data

US 2018/0108869 A1    Apr. 19, 2018

(30) Foreign Application Priority Data

Oct. 18, 2016  (JP) .................................. 2016-204297

(51) Int. Cl.
    *H01L 51/52*  (2006.01)
    *H01L 27/32*  (2006.01)
    *H01L 51/56*  (2006.01)

(52) U.S. Cl.
    CPC ........ *H01L 51/5265* (2013.01); *H01L 27/322* (2013.01); *H01L 27/3211* (2013.01); *H01L 27/3248* (2013.01); *H01L 51/5218* (2013.01); *H01L 51/5271* (2013.01); *H01L 51/5275* (2013.01); *H01L 51/56* (2013.01); *H01L 2227/323* (2013.01)

(58) Field of Classification Search
    None
    See application file for complete search history.

(56) References Cited

U.S. PATENT DOCUMENTS

| 5,844,289 | A | * | 12/1998 | Teranishi | .......... H01L 27/14609 257/432 |
| 2011/0156578 | A1 | * | 6/2011 | Jeon | .................... H01L 51/5253 313/506 |
| 2014/0167006 | A1 | * | 6/2014 | Kim | ..................... H01L 27/3244 257/40 |
| 2015/0333293 | A1 | * | 11/2015 | Poon | ................... H01L 51/5253 257/40 |
| 2017/0250231 | A1 |   | 8/2017 | Maeda et al. | |
| 2018/0097045 | A1 | * | 4/2018 | Maeda | ................ H01L 51/5253 |

FOREIGN PATENT DOCUMENTS

| JP | 2009-187748 A | 8/2009 |
| JP | 2013-051155 A | 3/2013 |
| JP | 2017-152329 A | 8/2017 |

\* cited by examiner

*Primary Examiner* — Lex H Malsawma
(74) *Attorney, Agent, or Firm* — Michael Best & Friedrich LLP

(57) ABSTRACT

Disclosed is a display device including: a substrate; and a first light-emitting element and a second light-emitting element over the substrate and adjacent to each other. The first light-emitting element and the second light-emitting element each possess a first electrode, an EL layer over the first electrode, a second electrode over the EL layer, and an optical adjustment layer over the second electrode. The optical adjustment layer over the first light-emitting element is different in refraction index from the optical adjustment layer over the second light-emitting element. A first material included in the optical adjustment layer may be the same in composition but different in chemical structure between before and after the light irradiation. Alternatively, the first material may be the same in composition but different in phase structure between before and after the light irradiation.

14 Claims, 20 Drawing Sheets

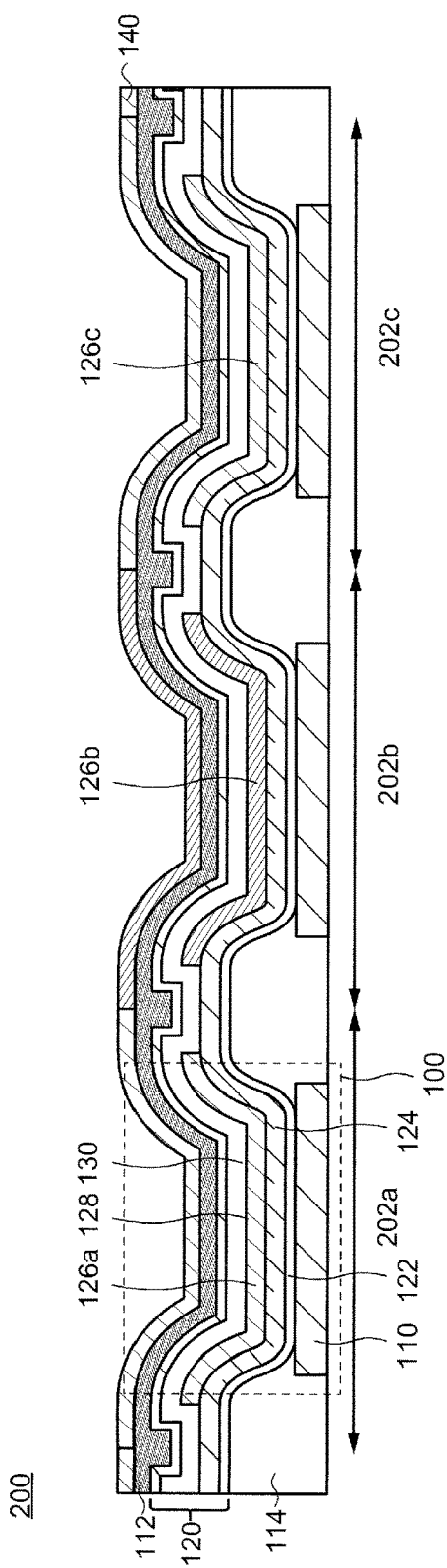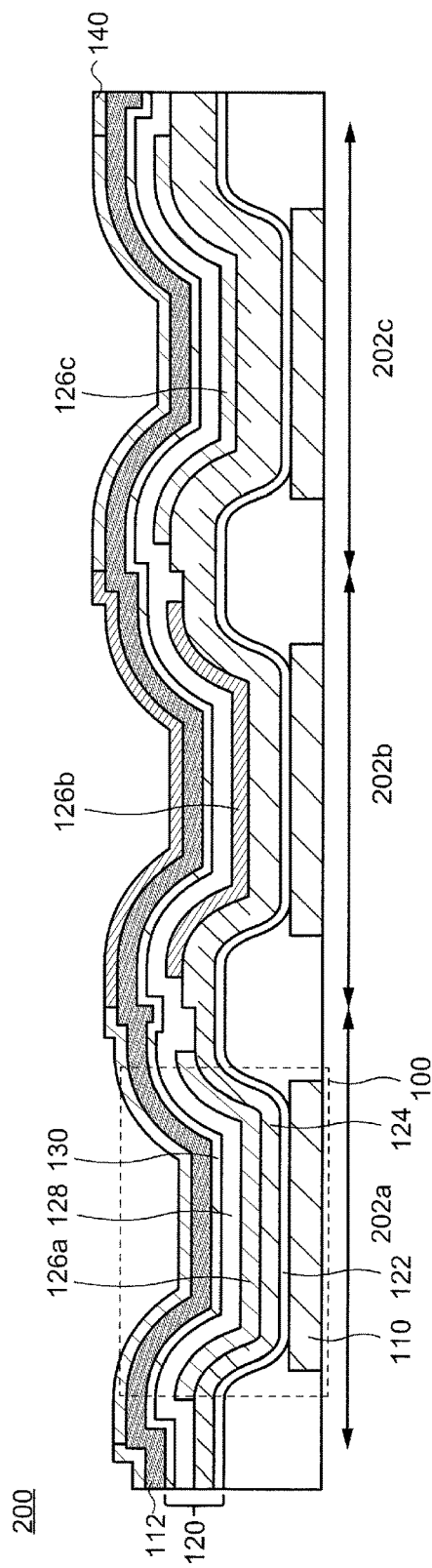

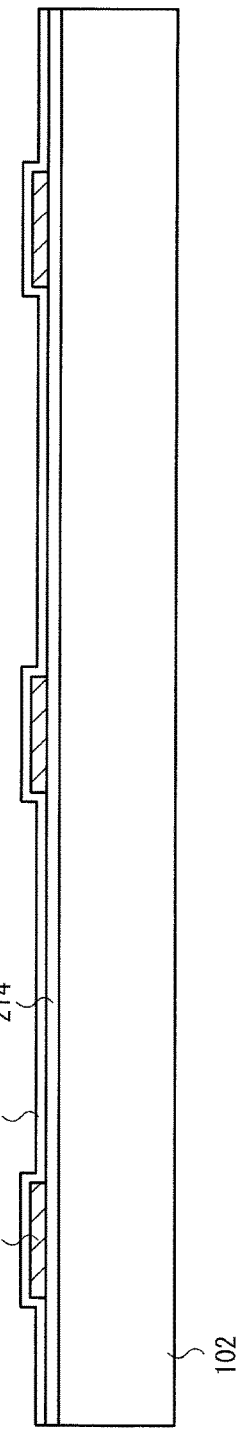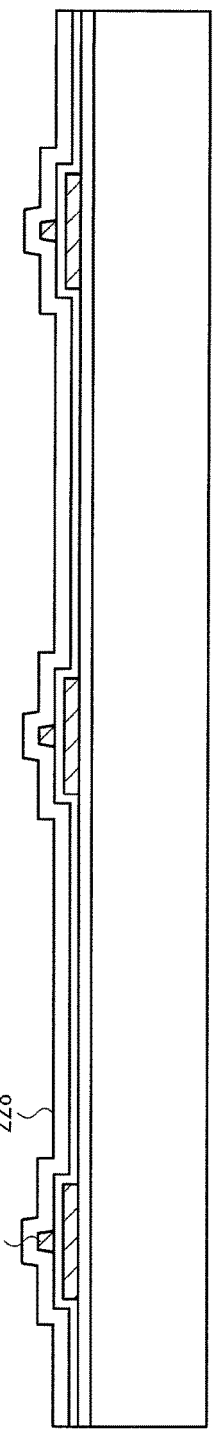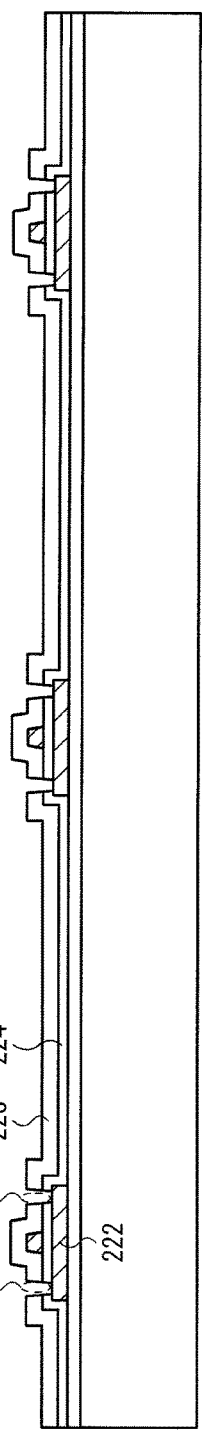

LIGHT-EMITTING WITH ADJUSTMENT LAYERS AND MANUFACTURING METHOD THEREOF

CROSS REFERENCE TO RELATED APPLICATIONS

This application is based on and claims the benefit of priority from the prior Japanese Patent Application No. 2016-204297, filed on Oct. 18, 2016, the entire contents of which are incorporated herein by reference.

FIELD

An embodiment of the present invention relates to a light-emitting element, a display device including the light-emitting element, and a manufacturing method of the display device.

BACKGROUND

An organic EL (Electroluminescence) display device is represented as an example of a display device. An organic EL display device has a plurality of pixels formed over a substrate and includes an organic light-emitting element (hereinafter, referred to as a light-emitting element) in each of the plurality of pixels. A light-emitting element possesses a layer (hereinafter, referred to as an organic layer or an EL layer) including an organic compound between a pair of electrodes (cathode and anode) and is operated by supplying current between the pair of electrodes. Color provided by a light-emitting element is mainly determined by a light-emitting material in an EL layer, and light emission with a variety of colors can be obtained by appropriately selecting a light-emitting material. Arrangement of a plurality of light-emitting elements giving different colors on a substrate makes it possible to reproduce a full-color image.

Emission color of a light-emitting element can also be adjusted by utilizing a light-interference effect in a light-emitting element. For example, it is disclosed in Japanese Patent Application Publications No. 2013-51155 and 2009-187748 that an optical adjustment layer is provided to one of the electrodes of a light-emitting element to control resonance of light emitted from the light-emitting element, thereby adjusting emission intensity and emission color.

SUMMARY

An embodiment of the present invention is a display device including: a substrate; and a first light-emitting element and a second light-emitting element over the substrate and adjacent to each other. The first light-emitting element and the second light-emitting element each possess a first electrode, an EL layer over the first electrode, a second electrode over the EL layer, and an optical adjustment layer over the second electrode. The optical adjustment layer over the first light-emitting element and the optical adjustment layer over the second light-emitting element are arranged to be continuously integrated. A refraction index of the optical adjustment layer over the first light-emitting element is different from that of the optical adjustment layer over the second light-emitting element.

An embodiment of the present invention is a method for manufacturing a display device. The method includes: forming a first electrode in each of a first pixel and a second pixel adjacent to the first pixel; forming an EL layer over the first electrode of the first pixel and the first electrode of the second pixel; forming a second electrode over the EL layer; and forming an optical adjustment layer over the second electrode, the optical adjustment layer being shared by the first pixel and the second pixel. The optical adjustment layer is different in refraction index between the first pixel and the second pixel.

BRIEF DESCRIPTION OF DRAWINGS

FIG. 2A and FIG. 2B are schematic cross-sectional views of a display device according to an embodiment of the present invention;

FIG. 11A to FIG. 11C are schematic cross-sectional views for explaining a manufacturing method of a display device according to an embodiment of the present invention;

DESCRIPTION OF EMBODIMENTS

Hereinafter, the embodiments of the present invention are explained with reference to the drawings. The invention can be implemented in a variety of different modes within its concept and should not be interpreted only within the disclosure of the embodiments exemplified below.

The drawings may be illustrated so that the width, thickness, shape, and the like are illustrated more schematically compared with those of the actual modes to provide a clearer explanation. However, they are only an example, and do not limit the interpretation of the invention. In the specification and the drawings, the same reference number is provided to an element that is the same as that which appears in preceding drawings, and a detailed explanation may be omitted as appropriate.

In the present invention, when a plurality of films is formed by performing etching or light irradiation on one film, the plurality of films may have functions or rules different from each other. However, the plurality of films originates from a film formed as the same layer in the same process and has the same layer structure and the same material. Therefore, the plurality of films is defined as films existing in the same layer.

In the specification and the scope of the claims, unless specifically stated, when a state is expressed where a structure is arranged "over" another structure, such an expression includes both a case where the substrate is arranged immediately above the "other structure" to be in contact with the "other structure" and a case where the structure is arranged over the "other structure" with an additional structure therebetween.

First Embodiment

1. Structure of Light-Emitting Element

Figure 1A:
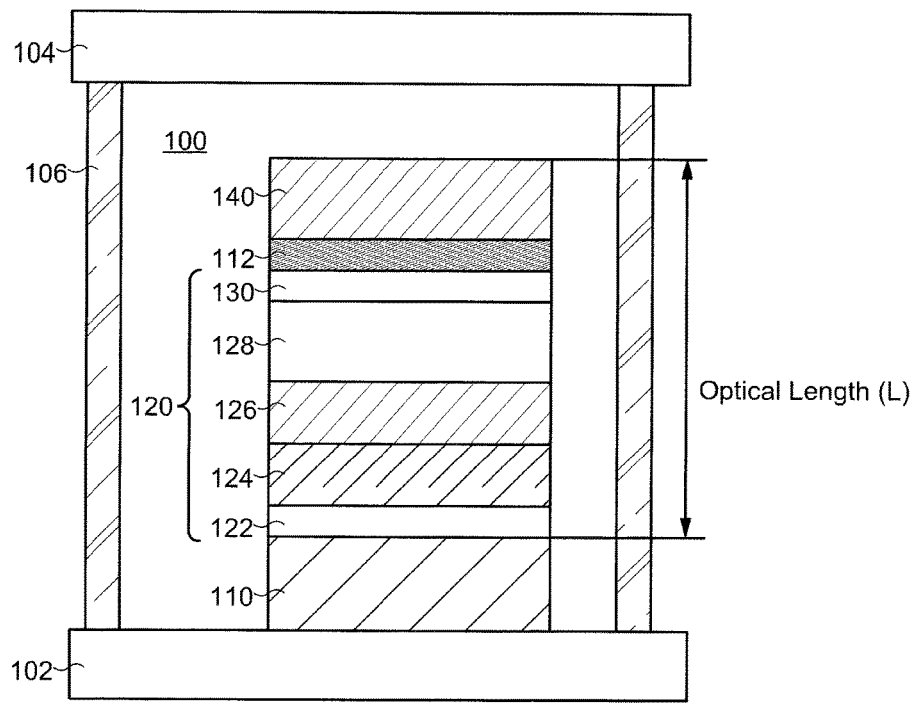
FIG. 1A and FIG. 1B are schematic cross-sectional views of a display element according to an embodiment of the present invention.

FIG. 1A is a schematic cross-sectional view of a light-emitting element 100 according to the First Embodiment. The light-emitting element 100 is arranged between a substrate 102 and an opposing substrate 104 and sealed with a sealer 106. Only one light-emitting element 100 is illustrated between the substrate 102 and the opposing substrate 104 In FIG. 1A. However, a plurality of light-emitting elements 100 may be disposed between the substrate 102 and the opposing substrate 104.

The light-emitting element 100 has a pair of electrodes (first electrode 110 and second electrode 112) and an EL layer 120 sandwiched therebetween. The first electrode 110 is in contact with the substrate 102 in FIG. 1A. However, a variety of insulating films or a variety of wirings for supplying power source to the first electrode 110 and the second electrode 112 may be formed between first electrode 110 and the substrate 102

The first electrode 110 and the second electrode 112 are configured so that one transmits visible light and the other reflects visible light. One of the first electrode 110 and the second electrode 112 functions as an anode, and the other serves as a cathode. In the present embodiment, explanation is given to an example where the first electrode 110 serves as an anode reflecting visible light and the second electrode 112 functions as a cathode transmitting visible light. In this case, the first electrode 110 can be formed by using a metal having a high reflectance or an alloy thereof. Alternatively, a film of a conductive oxide with a light-transmitting property may be formed over a film including the metal or the alloy. Indium-tin oxide (ITO), indium-zinc oxide (IZO), and the like are exemplified as a conductive oxide. As the second electrode 112, it is possible to use a metal thin film including a metal such as aluminum, magnesium, and silver or an alloy thereof and having a thickness which allows visible light to transmit therethrough. Alternatively, a conductive oxide with a light-transmitting property, such as ITO and IZO, may be used. When the metal thin film is employed as the second electrode 112, a conductive oxide with a light-transmitting property may be stacked over the metal thin film.

A structure of the EL layer 120 may be arbitrarily determined, and the EL layer 120 may be structured with a plurality of layers having different functions. The EL layer 120 of the light-emitting element 100 shown in FIG. 1A has a hole-injection layer 122, a hole-transporting layer 124, an emission layer 126, an electron-transporting layer 128, and an electron-injection layer 130. Each layer may have a single-layer structure or may be formed with stacked layers of different materials. Alternatively, the EL layer 120 may not include all of these layers and may further contain a layer with another function. For example, the EL layer 120 may include a hole-blocking layer, an electron-blocking layer, an exciton-blocking layer, and the like. Alternatively, one layer may have functions of two layers.

A potential difference is provided between the first electrode 110 and the second electrode 112, by which holes and electrodes are injected to the EL layer 120 from the former and latter, respectively. Holes are transported to the emission layer 126 through the hole-injection layer 122 and the hole-transporting layer 124. Electrons are transported to the emission layer 126 through the electron-injection layer 130 and the electron-transporting layer 128. Holes and electrons are recombined in the emission layer 126, giving an excited state of a light-emitting material included in the emission layer 126. When the excited state is relaxed to a ground state, light with a wavelength corresponding to an energy difference between the excited state and the ground state is released and observed as light emission from the light-emitting element 100.

For the hole-injection layer 122, a compound to which holes are readily injected, that is, a compound readily oxidized (i.e., electron-donating compound) can be used. In other words, a compound whose level of the highest occupied molecular orbiltal (HOMO) is shallow can be used. For example, an aromatic amine such as a benzidine derivative and a triarylamine, a carbazole derivative, a thiophene derivative, a phthalocyanine derivative such as copper phthalocyanine, and the like can be used. Alternatively, a polymer material such as a polythiophene derivative or a polyaniline derivative may be used. Poly(3,4-ethylenedioxydithiophene)/poly(styrenesulfonic acid) is represented as an example. Alternatively, a mixture of an electron-donating compound such as the aforementioned aromatic amine, a carbazole derivative, or an aromatic hydrocarbon with an electron acceptor may be used. As an electron acceptor, a transition-metal oxide such as vanadium oxide and molybdenum oxide, a nitrogen-containing heteroaromatic compound, an aromatic compound having a strong electron-withdrawing group such as a cyano group, and the like are represented.

The hole-transporting layer 124 has a function to transport holes injected to the hole-injection layer 122 to the emission layer 126, and a material the same as or similar to the material usable in the hole-injection layer 122 can be used. For example, it is possible to use a material having a deeper HOMO level than that of the hole-injection layer 122 and having a difference in HOMO level from the hole-injection layer 122 by approximately 0.5 eV or less.

The emission layer 126 may be formed with a single compound or have the so-called host-guest type structure. In the case of the host-guest type structure, a stillbene derivative, a condensed aromatic compound such as an anthracene derivative, a carbazole derivative, a metal complex including a ligand having a benzoquinolinol as a basic skeleton, an aromatic amine, a nitrogen-containing heteroaromatic compound such as a phenanthroline derivative, and the like can be used as a host material, for example. A fluorescent material such as a coumarin derivative, a pyran derivative, a quinacridone derivative, a tetracene derivative, a pyrene derivative, and an anthracene derivative, or a phosphorescent material such as an irridium-based orthometal complex can be used as a guest. When the emission layer 126 is configured with a single compound, the aforementioned host material can be used.

The electron-transporting layer 128 has a function to transport electrones injected from the second electrode 112 through the electron-injection layer 130 to the emission layer 126. For the electron-transporting layer 128, a compound readily reduced (i.e., electron-accepting compound) can be used. In other words, a compound whose level of the lowest unoccupied molecular orbiltal (LUMO) is deep can be used. For example, a metal complex including a ligand having a benzoquinolinol as a basic skeleton, such as tris(8-quinolinolato)aluminum and tris(4-methyl-8-quinolinolato)aluminum, a metal complex including a ligand having an oxathiazole or thiazole as a basic skeleton, and the like are represented. In addition to these metal complexes, a compound with an electron-deficient heteroaromatic ring, such as an oxadiazole derivative, a thiazole derivative, a triazole derivative, and a phenanthroline derivative, can be used.

For the electron-injection layer 130, a compound which promotes electron injection to the electron-transporting layer 128 from the second electrode 112 can be used. For example, a mixture of a compound usable in the electron-transporting layer 128 with an electron-donating material such as lithium or magnesium can be used. Alternatively, an inorganic compound such as lithium fluoride and calcium fluoride may be used.

Each layer included in the EL layer 120 may be formed by applying a wet-type film-forming method such as an ink-jet method, a spin-coating method, and an printing method or a dry-type film-forming method such as an evaporation method.

The light-emitting element 100 further possesses an optical adjustment layer 140 over the second electrode 112. The optical adjustment layer 140 may be in contact with the second electrode 112. The optical adjustment layer 140 may include one kind or many kinds of materials which vary in refraction index upon light-irradiation. In the present specification, a material which varies in refraction index upon light-irradiation is called a photorefractive material. Generally, a photorefractive material is defined, in a narrow sense, as a material in which an electric field is generated by light absorption and which undergoes variation in refraction index promoted by an electroptic effect caused by the electric field. A photorefractive material is defined, in a wide sense, as a material which varies in refraction index by absorbing light. In the present specification and claims, the latter definition is employed.

The photorefracitve material is selected from a material which, upon light irradiation, i.e., light absorption, undergoes a change in phase (change in crystal state), a chemical change with a composition change, or a chemical change (isomerization) without a composition change. The photorefractive material may vary in refraction index through concerted action of these mechanisms. These variations may be reversible or irreversible. The refraction index of the photorefractive material may be increased or decreased upon light-irradiation. The variation in refractive index may be accompanied by a change of other properties (e.g., absorption property, emission property, or the like).

Light-irradiation causes variation of the refraction index of the photorefractive material, which results in variation of the refraction index of the optical adjustment layer 140. However, a thickness of the optical adjustment layer 140 does not substantially change. Hence, an optical thickness (a product of a thickness by a refraction index) of the optical adjustment layer 140 can be changed by light-irradiation.

As a material which varies in refraction index by a phase change, a chalcogen such as tellurium and a compound including an element of the nitrogen group, such as antimony are exemplified. For example, a Ge—Te-based binary compound, a Ge—Te—Sb-based ternary compound, a Ge—Sb—Te-based ternary compound, a Ag—In—Sb—Te-based quartenary compound, and the like are represented. Alternatively, a transition metal oxide such as cobalt oxide and iron oxide may be used. These materials undergo a phase change between a crystal phase and an amorphous phase by irradiating with light such as a laser and a change in refraction index simultaneously occurs.

Alternatively, a polymer material such as an epoxy resin, an acrylic resin, a polyimide resin, and a polycarbonate resin may be used. These polymers are locally melted by light irradiation, and a sequential rapid cooling process causes recrystallization, which results in a change in crystal state between before and after light-irradiation.

A material which varies in refraction index by a chemical change with a composition change is represented by an organic compound such as a cyanine-based pigment, a phthalocyanine-based pigment, and an azo-based pigment, for example. These compounds chemically react by photoenergy, which is accompanied by a change in composition or molecular structure. Alternatively, an irreversible chemical change occurs although no change in composition takes place.

As a material which changes in refractive index through isomerization, a so-called photochromic material is represented. For example, the following are provided: a chalcone (benzylidene acetophenone) derivative, a cinnamic ester derivative, a norbornadiene derivative, an azobenzene derivative, a diarylethene derivative, a spiropyran derivative, a flugide derivative, a stillbene derivative, an arylarylethene, an arylbenzothienylethene, a viologen derivative, a paracyclophane derivative in which two imidazole skeletons are linked with cyclophane, and the like. These compounds may be used singly or used by dispersing in a polymer material such as an acrylic resin, a polycarbonate resin, an epoxy resin, and a polyimide resin.

The light-emitting element 100 may be configured so that a top surface of the optical adjustment layer 140 is directly exposed to a space surrounded by the substrate 102, the opposing substrate 104, and the sealer 106. In this case, an inert gas such as nitrogen and argon can be sealed in this space, which allows the optical adjustment layer 140 to make contact with a layer of an inert gas. A refractive index of the layer of an inert gas is substantially 1. On the other hand, the refractive index of the optical adjustment layer 140 is larger than that of the layer of an inert gas and is approximately from 2.0 to 2.5, depending on the kind of photorefractive material.

Figure 1B:
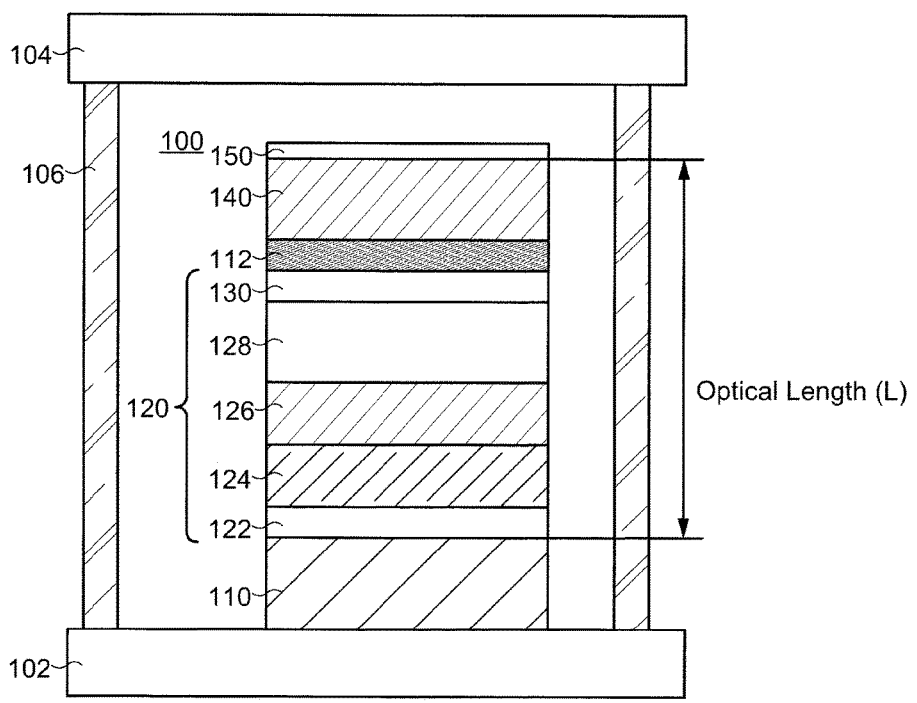

Alternatively, the light-emitting element 100 may possess a passivation film 150 over the optical adjustment layer 140 as shown in FIG. 1B. The passivation film 150 has a function to prevent the entrance of impurities such as water and oxygen to the light-emitting element 100 and simultaneously possesses a function to reflect light from the emission layer 126 at an interface with the optical adjustment layer 140. Therefore, it is preferred that the passivation film 150 have a material having low gas permeability and exhibiting a large difference in refractive index from the photorefractive material in the optical adjustment layer 140. An inorganic compound including silicon is exemplified, and silicon nitride, silicon oxynitride, and the like typify such a material. In this case, a refractive index of an inorganic compound including silicon is approximately 1.8, depending on film-formation conditions.

In each case, it is preferred that a difference in refraction index between the optical adjustment layer 140 and a layer thereover (the aforementioned space or the passivation film 150) be approximately from 0.2 to 0.7. However, the difference is not limited to this value because the optimum refraction indexes of the optical adjustment layer 140 and a layer thereover change in accordance with a wavelength of light passing therethrough and their thicknesses.

[2. Resonance Structure]

As described above, the first electrode 110 of the light-emitting element 100 is configured to reflect visible light, while the second electrode 112 is configured to transmit visible light. Additionally, arrangement of the optical adjustment layer 140 makes it possible to produce a large difference in refraction index between the optical adjustment layer 140 and the layer thereover. Therefore, the light radiated from the emission layer 126 is reflected at a top surface of the first electrode 110 (an interface between the first electrode 110 and the hole-injection layer 122) and at the top surface of the optical adjustment layer 140 (an interface between the optical adjustment layer 140 and the space or an interface between the optical adjustment layer 140 and the passivation film 150) so as to undergo resonance. The interference effect by the resonance is determined by an optical length L between the top surface of the first electrode 110 and the top surface of the optical adjustment layer 140 and a spectrum of the emission from the emission layer 126. Here, the optical length L is a summation of the products of a thickness and a refraction index of each layer disposed between the top surface of the first electrode 110 and the top surface of the optical adjustment layer 140.

Therefore, the optical length L is adjusted so that the emission is amplified, that is, the optical length L is equal to an integral multiple of a half wavelength of a target emission by which the emission intensity can be increased and the emission spectrum can be narrowed. For example, in the case where the light-emitting element 100 has a blue-emissive emission layer 126 and light at 450 nm is amplified as blue light, the light-emitting element 100 may be configured so that the optical length L is an integral multiple of 225 nm. In the case where the light-emitting element 100 has a green-emissive emission layer 126 and light at 530 nm is amplified as green light, for example, the light-emitting element 100 may be configured so that the optical length L is an integral multiple of 265 nm. Similarly, in the case where the light-emitting element 100 has a red-emissive emission layer 126 and light at 750 nm is amplified as green light, for example, the light-emitting element 100 may be configured so that the optical length L is an integral multiple of 375 nm.

It is not always possible to freely select the material or design the thickness of each layer constructing the EL layer 120. For instance, it is necessary to set an emission position in the light-emitting element 100 and maintain appropriate carrier balance in view of carrier mobility of each layer. Moreover, there is a limitation to the thickness of each layer in view of the driving voltage. Hence, an appropriate resonance structure cannot be always readily obtained by simply designing the EL layer 120.

However, the light-emitting element 100 has the optical adjustment layer 140, and the refraction index thereof can be changed by light-irradiation. Thus, the refraction index of the optical adjustment layer 140 can be controlled by performing or not performing the light irradiation or by appropriately adjusting a wavelength of the applied light and irradiation time. Accordingly, even if the optical length L of the EL layer 120 of the light-emitting element 100 is not appropriate to sufficiently amplify light with a target wavelength, the optical length L can be optimized by controlling the change of the refraction index of the optical adjustment layer 140. As a result, the emission intensity in a front direction of the light-emitting element 100 can be increased and the spectrum thereof can be narrowed.

In addition, when the emission layer 126 provides white emission, it is possible to extract different emission colors from different light-emitting elements 100 by controlling the refractive index of the optical adjustment layer 140 in every light-emitting element. Thus, the optical adjustment layer 140 also serves as a color filter. When a plurality of white-emissive light-emitting elements is arranged and a variety of colors is extracted by using a color filter, a color filter is usually disposed close to the opposing substrate 104. Hence, when a viewing angle is large, a part of the emission from an emission layer is observed through a color filter over the adjacent pixel because a distance between the color filter and the emission layer is large. As a result, the so-called color shift phenomenon occurs, leading to a decrease in display quality.

However, as described above, the optical adjustment layer 140 can be arranged so as to be in contact with the second electrode 112. Accordingly, application of the present embodiment allows the distance between the emission region and the optical adjustment layer 140 to be reduced and efficiently prevents the generation of the color shift phenomenon.

Second Embodiment

In the present embodiment, a display device 200 having a plurality of light-emitting elements 100 described in the First Embodiment is explained. Explanation of the structures the same as those of the First Embodiment may be omitted.

1. Structure

FIG. 2A is a schematic cross-sectional view of a display device 200. The display device 200 possesses a plurality of pixels 202, and three pixels 202a, 202b, and 202c of the plurality of pixels 202 are illustrated in this cross-sectional view. The pixel 202b is adjacent to the pixel 202a and the pixel 202c. Note that a substrate for supporting the pixels 102 and a variety of circuits for driving the pixels 202 are omitted in FIG. 2A.

The pixels 202 each have the first electrode 110 and the second electrode 112. The first electrodes 110 are independently disposed in the pixels 202a, 202b, and 202c and electrically disconnected from one another by a partition wall 114. The partition wall 114 covers edge portions of the first electrodes 110 and has a role to absorb depressions and projections resulting from a thickness of the first electrode 110. The second electrode 112 is continuously provided over the plurality of pixels 202a, 202b, and 202c. Thus, the second electrode 112 is shared by the plurality of pixels 202a, 202b, and 202c. The EL layer 120 is provided between the first electrode 110 and the second electrode 112 in each of the pixels 202a, 202b, and 202c. The structure of the EL layer is the same as that described in the First Embodiment.

In FIG. 2A, the layers other than the emission layer 126 of the EL layer 120, that is, the hole-injection layer 122, the hole-transporting layer 124, the electron-transporting layer 128, and the electron-injection layer 130 are continuously formed through the pixels 202a, 202b, and 202c and shared by the pixels 202a, 202b, and 202c. On the other hand, the emission layer 126 is formed pixel-by-pixel in the pixels 202a, 202b, and 202c. The use of such a structure allows the pixels 202a, 202b, and 202c to have the emission layers (126a, 126b, and 126c) having emission materials different from one another, by which emission colors different from one another can be produced. For example, when the emission layers 126a, 126b, and 126c include light-emitting materials respectively giving blue, green, and red emissions, full-color display can be achieved by extracting three primary colors from the pixels 202a, 202b, and 202c. In the example shown in FIG. 2A, the emission layers 126a, 126b, and 126c are not in contact with one another, and the hole-transporting layer 124 and the electron-transporting layer 128 are in contact with each other over the partition wall 114. However, the emission layers 126a, 126b, and 126c may be formed so as to overlap with one another over the partition wall 114.

In the display device 200 shown in FIG. 2A, the layers other than the emission layer 126 have the same structure between the pixels 202a, 202b, and 202c. However, these layers may have different structures or thicknesses between the pixels. For example, as shown in FIG. 2B, the display device 200 may be configured so that a thickness of the hole-transporting layer 124 is different between the pixels 202a, 202b, and 202c. Alternatively, although not shown, a thickness or a stacking structure of the hole-injection layer 122 and the electron-transporting layer 128 may be different between the pixels. Such a configuration of the display device 200 makes it possible to change the optical length L of the light-emitting element 100 to be changed in every pixel. As a result, the resonance structure can be constructed more appropriately in each pixel 202.

The display device 200 possesses the optical adjustment layer 140 over the second electrode 112 (FIG. 2A and FIG. 2B). The structure of the optical adjustment layer 140 is the same as that described in the First Embodiment. The optical adjustment layer 140 may be continuously formed through the pixels 202a, 202b, and 202c. In this case, the optical adjustment layer 140 is shared by the pixels 202a, 202b, and 202c.

The optical adjustment layer 140 may have the same photorefractive material between the pixels 202a, 202b, and 202c. However, the photorefractive material may have the same composition but a different chemical structure between the different pixels. Alternatively, the photorefractive material may have the same composition but a different phase structure (crystal structure) between the different pixels. In the case where the photorefractive material takes a plurality of phase structures in the same layer, a state where the phase structures are different includes a state where a composition thereof is different. Alternatively, the photorefractive materials may be different in composition between the different pixels. Therefore, the optical adjustment layer 140 may be different in refractive index between different pixels. For example, the refractive index of the optical adjustment layer 140 may be different between the adjacent pixels 202a and 202b. The refractive index of the optical adjustment layer may be different from one another between the continuous pixels 202a, 202b, and 202c.

Figure 3:
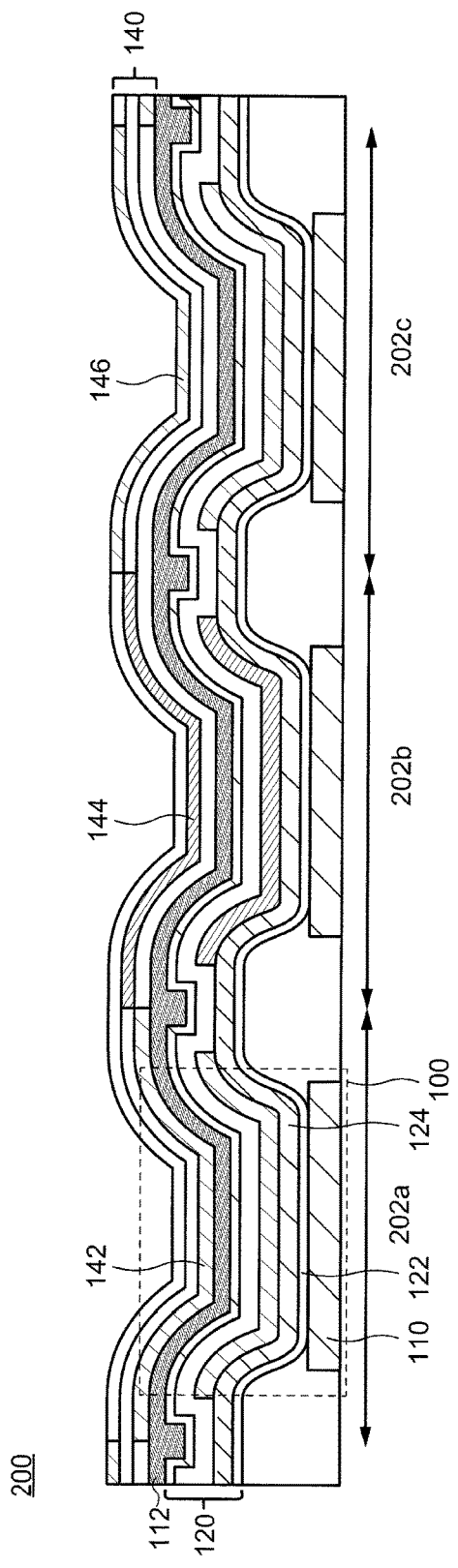
FIG. 3 is a schematic cross-sectional view of a display device according to an embodiment of the present invention.

The number of optical adjustment layers of the display device 200 is arbitrarily determined. For example, the optical adjustment layer 140 may have a stacked structure including a plurality of layers as shown in FIG. 3. A structure is shown in FIG. 3 in which three optical adjustment layers (a first optical adjustment layer 142, a second optical adjustment layer 144, and a third optical adjustment layer 146) are arranged. In this case, although the photorefractive material is the same regardless of the pixels in each of the first optical adjustment layer 142, the second optical adjustment layer 144, and the third optical adjustment layer 146, the first optical adjustment layer 142, the second optical adjustment layer 144, and the third optical adjustment layer 146 may contain different photorefractive materials from one another.

When the optical adjustment layer 140 has a stacked structure, it is possible to arbitrarily adjust, pixel-by-pixel, the refraction indexes of the optical adjustment layers 142, 144, and 146. With respect to the example shown in FIG. 3, the refraction index of the photorefractive material of the pixel 202a is different from those of the pixels 102b and 102c in the first optical adjustment layer 142. In the second optical adjustment layer 144, the refraction index of the photorefractive material of the pixel 202b is different from those of the pixels 102a and 102c. In the third optical adjustment layer 146, the refraction index of the photorefractive material of the pixel 202c is different from those of the pixels 102a and 102b. Adjustment of the optical adjustment layer 140 in such a manner allows for adjustment of the resonance structure of the light-emitting element so as to be optimized for the emission color of the respective pixels 202.

Although not illustrated, the optical adjustment layer 140 may have a single-layer structure and include a plurality of different photorefractive materials. In this case, the photorefractive materials are selected so that their behavior of the change in refractive index is different from one another. For example, the photorefractive materials are selected so that their absorption properties or the refraction indexes are different from one another.

Figure 4:
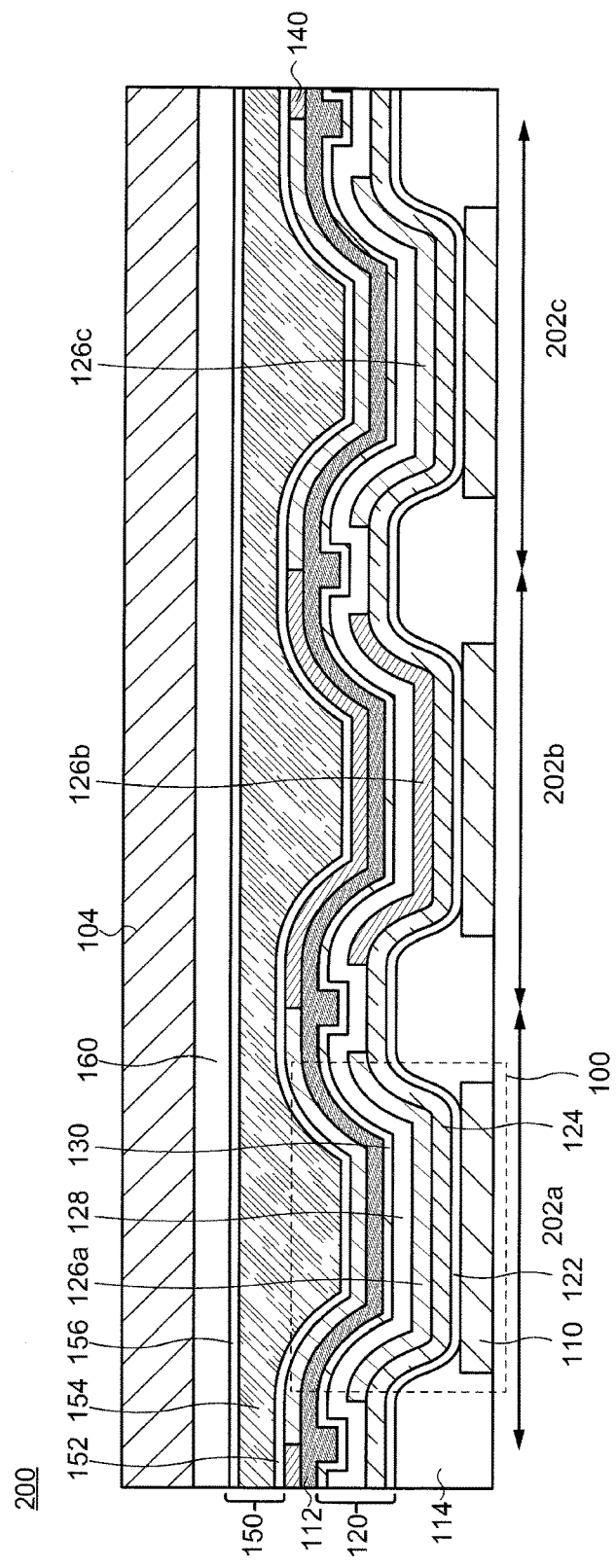
FIG. 4 is a schematic cross-sectional view of a display device according to an embodiment of the present invention.

As described in the First Embodiment, the display device 200 may have the passivation film 150 over the optical adjustment layer 140 (see FIG. 4). The passivation film 150 has a function to prevent impurities such as water and oxygen from entering the light-emitting element 100 from outside, thereby improving reliability of the light-emitting element 100. The structure of the passivation film 150 can be arbitrarily determined, and the passivation film 150 may have a three-layer structure as shown in FIG. 4, for example. In this case, the passivation film 150 may have a first layer 152, a second layer 154, and a third layer 156. The first layer 152 and the third layer 156 may include an inorganic compound, and the second layer 154 may contain an organic compound, for example. The second layer 154 may be formed at a thickness so that depressions and projections caused by the partition wall 114 and the like are absorbed and a flat surface is provided. It is preferred that the third layer 156 include a material having a large difference in refractive index from the optical adjustment layer 140, by which a reflectance at the top surface of the optical adjustment layer 140 can be increased.

The opposing substrate 104 may be provided over the passivation film 150 via a filler 160. Thus, the filler 160 also functions as an adhesive. The display device 200 including the light-emitting element 100 is physically protected by the opposing substrate 104.

2. Control of Resonance by Optical Adjustment Layer

Figure 5:
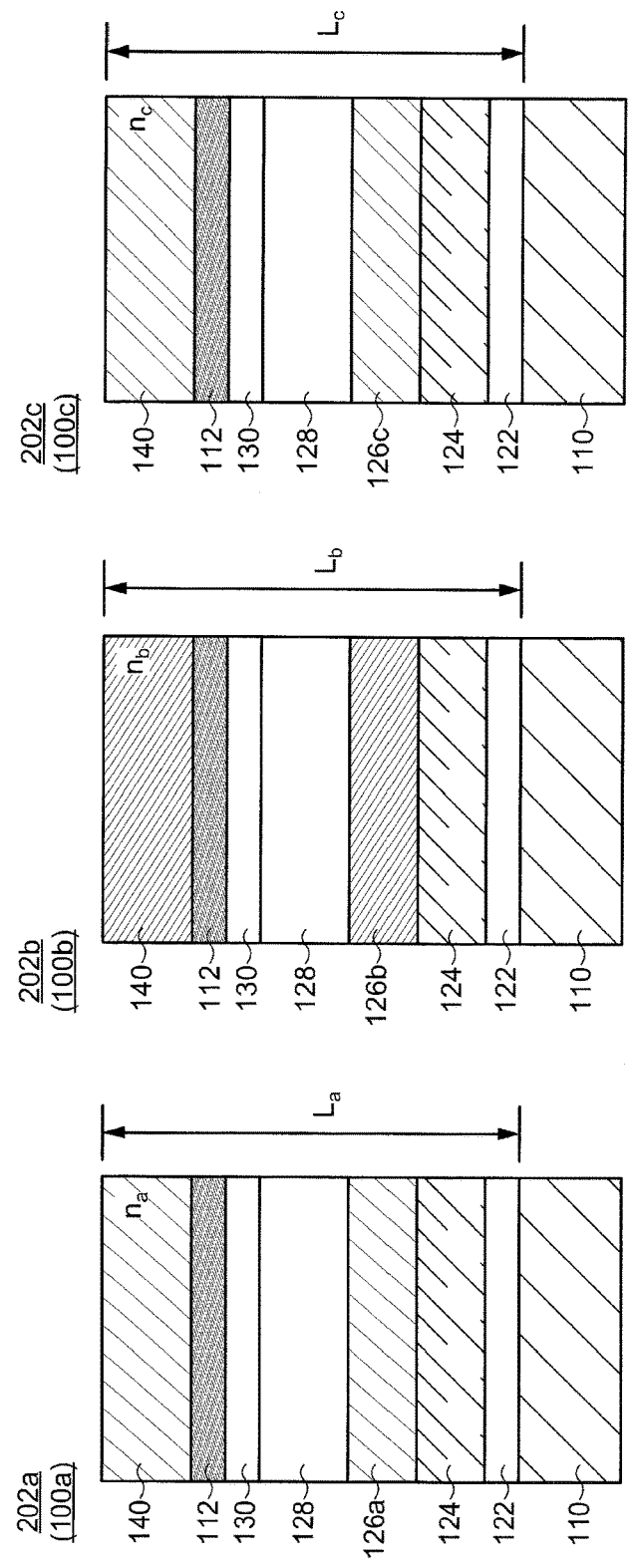
FIG. 5 is a schematic cross-sectional view of a display element included in a display device according to an embodiment of the present invention.
Figure 6:
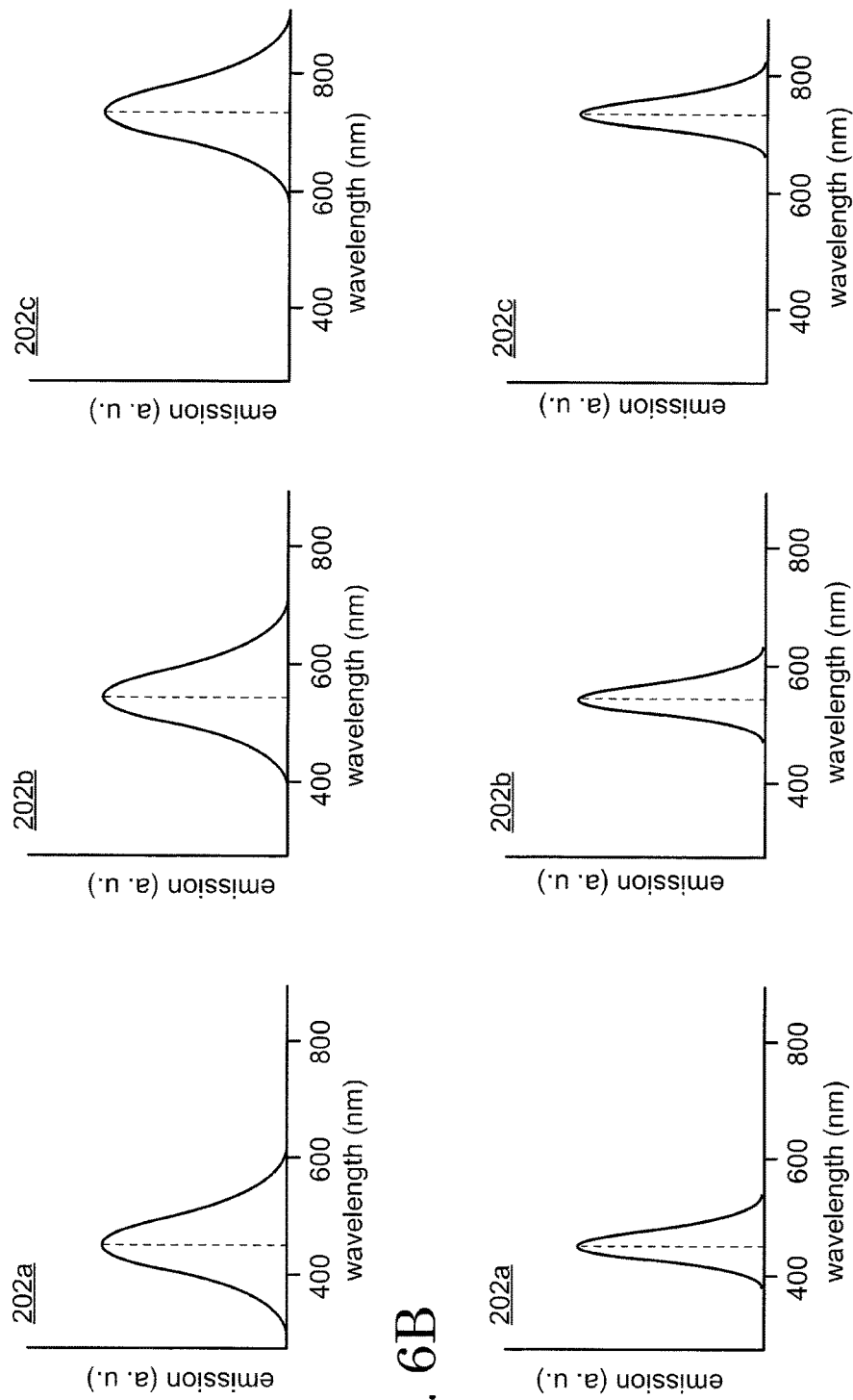
FIG. 6A and FIG. 6B are drawings for explaining emission spectra of a display device according to an embodiment of the present invention.

Control of the resonance of the display device 200 by using the optical adjustment layer 140 is explained by using FIG. 5, FIG. 6A, and FIG. 6B. Here, explanation is provided for a case where the emission layers 126a, 126b, and 126c respectively giving blue, green, and red emissions are respectively formed in the pixels 202a, 202b, and 202c.

FIG. 5 shows schematic structures of the light-emitting elements 100a, 100b, and 100c respectively disposed in the pixels 202a, 202b, and 202c. The light-emitting elements 100a, 100b, and 100c are different in structure of the emission layers 126a, 126b, and 126c from one another. That is, at least one of the materials each included in the emission layers 126a, 126b, and 126c is different. Additionally, the optical adjustment layers 140 formed in the pixels 202a, 202b, and 202c are different in refraction index from one another. Their refractive indexes are $n_a$, $n_b$, and $n_c$, respectively. As shown in FIG. 6A, light having a peak in a blue region (e.g., around 450 nm), light having a peak in a green region (e.g., around 550 nm), and light having a peak in a red region (e.g., around 700 nm) are respectively obtained from the emission layers 126a, 126b, and 126c arranged in the pixels 202a, 202b, and 202c, respectively.

Here, the refractive indexes of the optical adjustment layers 140 are adjusted so as to be $n_a<n_b<n_c$. For example, when the refractive index of the photorefractive material increases upon light irradiation, light irradiation may be performed on the optical adjustment layer 140 so that light-irradiation times $t_a$, $t_b$, and $t_c$ on the respective pixels 202a, 202b, and 202c is $t_a<t_b<t_c$. In contrast, when the refractive index of the photorefractive material decreases upon light irradiation, light irradiation may be performed on the optical adjustment layer 140 so that light-irradiation times $t_a$, $t_b$, and $t_c$ on the respective pixels 202a, 202b, and 202c is $t_a>t_b>t_c$. The optical length of the EL layer 120 and the second electrode 112 are substantially the same as long as their thicknesses are not extremely different from each other. However, the optical lengths $L_a$, $L_b$, and $L_c$ of the light-emitting elements 100a, 100b, and 100c can be controlled so as to be $L_a<L_b<L_c$ by controlling the light-irradiation time as described above. Therefore, a resonance structure optimum for amplification of short-wavelength light is obtained in the pixel 202a, while a resonance structure optimum for amplification of long-wavelength light is obtained in the pixel 202c. In contrast, a resonance structure optimum for amplification of middle-wavelength light is obtained in the pixel 202b. Hence, the resonance structures of the pixels 202a, 202b, and 202c can be optimized for blue, green, and red emissions, respectively, and the widths of the spectra observed from a front side of the display device 200 are decreased. As a result, color purity of each of the pixels 202a, 202b, and 202c is improved, and the display device 200 excellent in color reproducibility can be obtained.

Third Embodiment

In the present embodiment, display device 210 having a different structure from that of the display device 200 described in the Second Embodiment is explained. Explanation of the structures the same as those of the First and Second Embodiments may be omitted.

1. Structure

Figure 7:
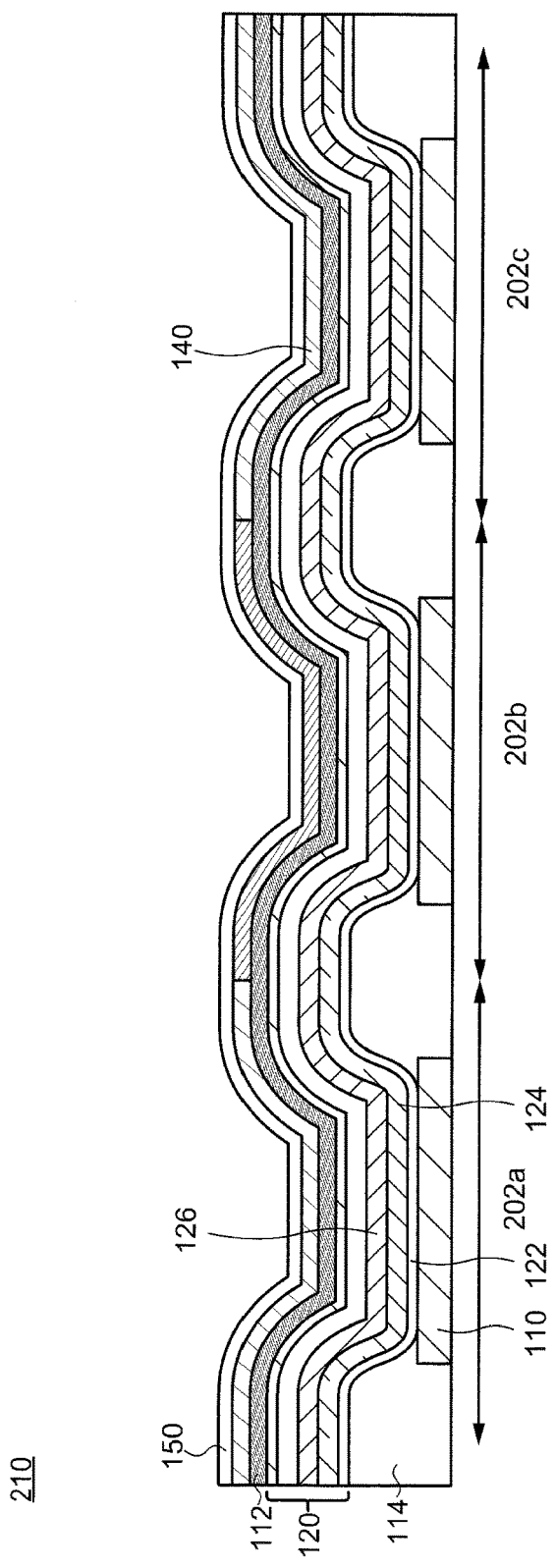
FIG. 7 is a schematic cross-sectional view of a display device according to an embodiment of the present invention.

The display device 210 is different from the display device 200 in that the emission layer 126 of the EL layer 120 included in the plurality of pixels 202 is the same between the pixels and that the EL layer 120 is configured to give white emission. More specifically, the emission layer 126 has the same structure between the pixels 202a, 202b, and 202c as shown in FIG. 7. In this case, the emission layer 126 can be continuously prepared through the pixels 202a, 202b, and 202c and shared by the pixels 202a, 202b, and 202c. The emission layer 126 may have a structure in which three emission layers respectively providing blue, green, and red colors are stacked, for example. Alternatively, the emission layer 126 may have a structure in which emission layers respectively providing blue and yellow colors are stacked. Alternatively, the emission layer 126 may have a structure in which emission layers respectively providing blue-green and red colors are stacked. Note that the layers other than the emission layer 126 may have different structures between the adjacent pixels 202.

The optical adjustment layer 140 may be structured with a single layer as described in the Second Embodiment or include a plurality of optical adjustment layers (e.g., the first optical adjustment photochromic layer 142, the second optical adjustment layer 144, and the third optical adjustment layer 146).

2. Control of Resonance by Optical Adjustment Layer

Figure 8A:
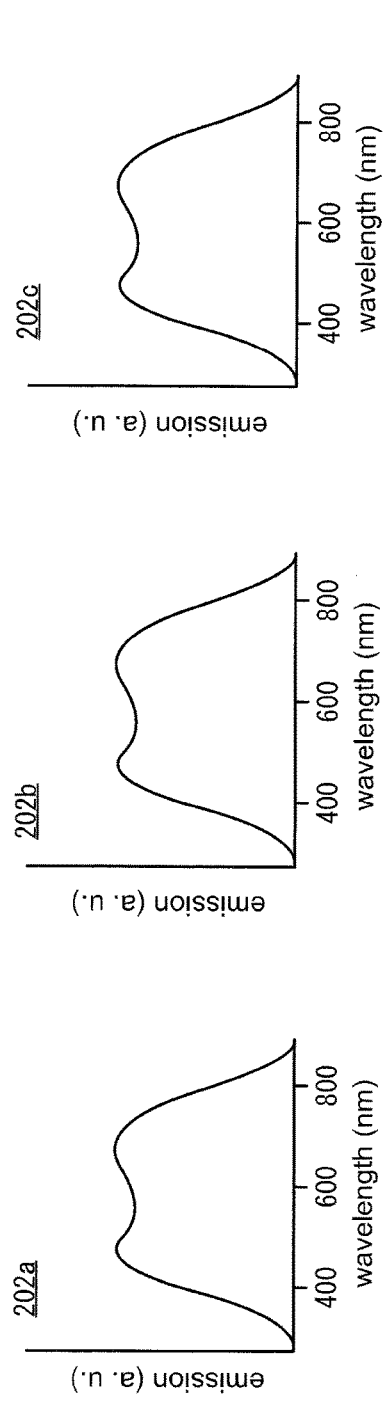
FIG. 8A and FIG. 8B are drawings for explaining emission spectra of a display device according to an embodiment of the present invention.
Figure 8B:
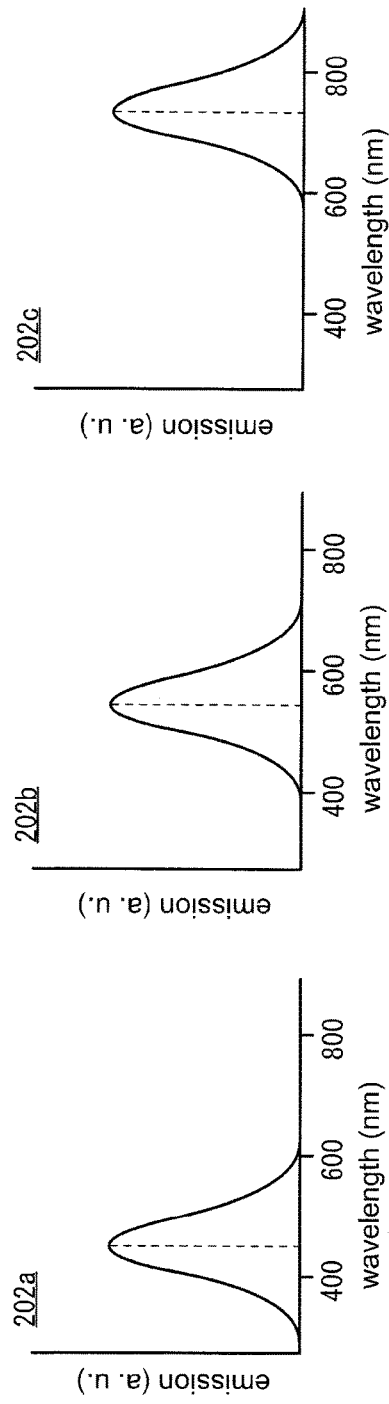

Control of the resonance of the display device 210 by using the optical adjustment layer 140 is explained by using FIG. 8A and FIG. 8B. Here, explanation is provided for a case where blue, green, and red emissions are respectively extracted from the pixels 202a, 202b, and 202c. Similar to the display device 200, the refractive indexes of the optical adjustment layer 140 in the pixels 202a, 202b, and 202c are $n_a$, $n_b$, and $n_c$, respectively, and therefore, the optical lengths $L_a$, $L_b$, and $L_c$, are $L_a<L_b<L_c$.

FIG. 8A shows, from left to right, the emission spectra given by the emission layer 126 included in the pixels 202a, 202b, and 202c. As described above, the emission layer 126 has the same structure between the pixels 202a, 202b, and 202c and provides white emission. Hence, these spectra are the same in shape, width, and cover substantially the whole of the visible region.

The pixel 202a has a resonance structure optimal for amplification of short-wavelength light. Thus, the pixel 202a amplifies light in a blue region (e.g., around 450 nm) and attenuates light with a wavelength far from this region. Hence, as shown in the drawing on the left side in FIG. 8B, an emission spectrum other than that in the blue region is attenuated, and blue emission can be mainly obtained from the pixel 202a.

On the contrary, the pixel 202c has a resonance structure optimal for amplification of long-wavelength light. Thus, the pixel 202c amplifies light in a red region (e.g., around 750 nm) and attenuates light with a wavelength far from this region. Hence, as shown in the drawing in the right side in FIG. 8B, an emission spectrum other than that in the red region is attenuated, and red emission can be mainly obtained from the pixel 202c.

On the other hand, the pixel 202b has a resonance structure optimal for amplification of middle-wavelength light. Thus, the pixel 202b amplifies light in a green region (e.g., around 530 nm) and attenuates light with a wavelength far from this region. Hence, as shown in the middle drawing in FIG. 8B, an emission spectrum other than that in the green region is attenuated, and green emission can be mainly obtained from the pixel 202b.

As described above, the formation of the optical adjustment layer 140 including a material which is capable of varying in refractive index or whose refractive index can be controlled by light-irradiation enables extraction of arbitrary color from the pixels 202 having a white-emissive light-emitting element even if a color filter is not arranged.

Fourth Embodiment

In the present embodiment, a manufacturing method of the display device 200 according to the present invention is explained. Explanation of the structures the same as those of the First to Third Embodiments may be omitted.

Figure 9:
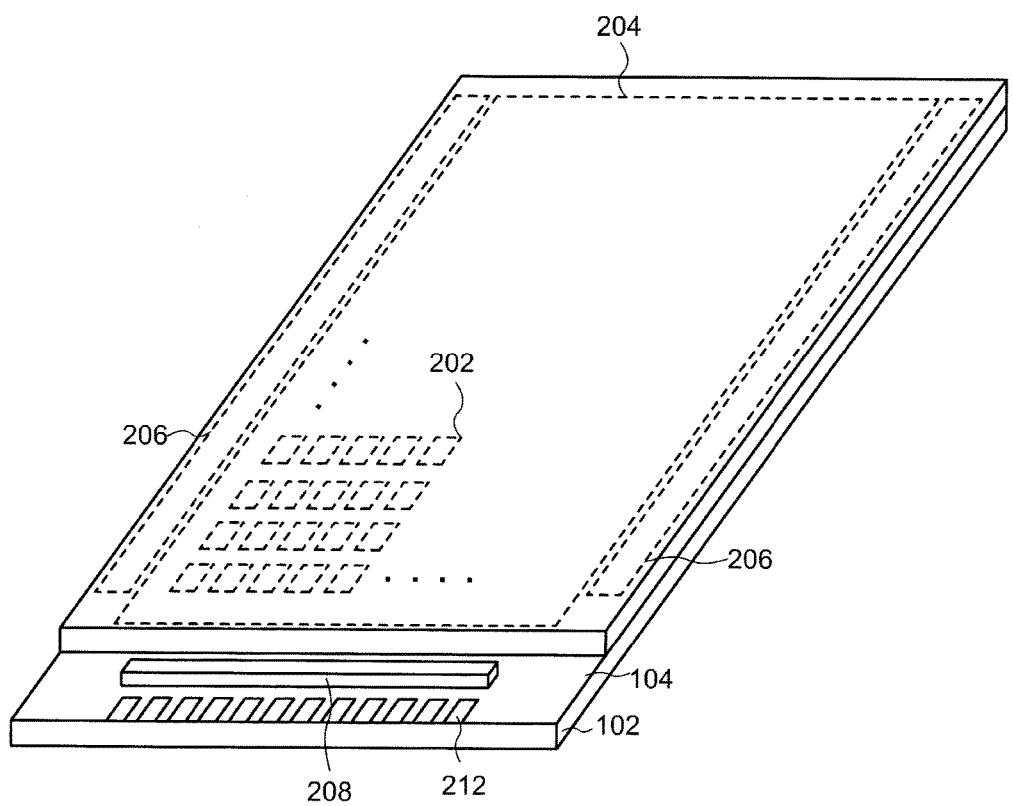
FIG. 9 is a schematic perspective view of a display device according to an embodiment of the present invention.

FIG. 9 is a perspective view of the display device 200. The display device 200 possesses, over one surface (top surface) of a substrate 102, a plurality of pixels 202 arranged in a row direction and a column direction, a display region 204 structured by the plurality of pixels 202, scanning-line driver circuits 206, and a data-line driver circuit 208. The opposing substrate 104 covers the display region 204. A variety of signals from an external circuit (not shown) is input to the scanning-line driver circuits 206 and the data-line driver circuit 208 through a connector such as a flexible printed circuit (FPC) connected to terminals 212 formed over the substrate 102, and each pixel 202 is controlled on the basis of these signals.

One or all of the scanning-line driver circuits 206 and the data-line driver circuit 208 may not be necessarily formed over the substrate 102 directly. A driver circuit formed over a substrate (e.g., semiconductor substrate) different from the substrate 102 may be mounted on the substrate 102 or the connector, and each pixel 202 may be controlled with the driver circuit. In FIG. 9, an example is shown where the scanning-line driver circuits 206 are covered by the opposing substrate 104, while the data-line driver circuit 208 is prepared over another substrate and then mounted on the substrate 102.

The substrate 102 and the opposing substrate 104 may be a substrate without flexibility, such as a glass substrate, or a substrate having flexibility. A structure may be employed in which a resin film or an optical film such as a circular polarizing plate is bonded instead of the opposing substrate 104. The pixels 202 are arranged in a matrix form. However, the arrangement is not limited, and a stripe arrangement, a delta arrangement, and the like may be applied.

Figure 10:
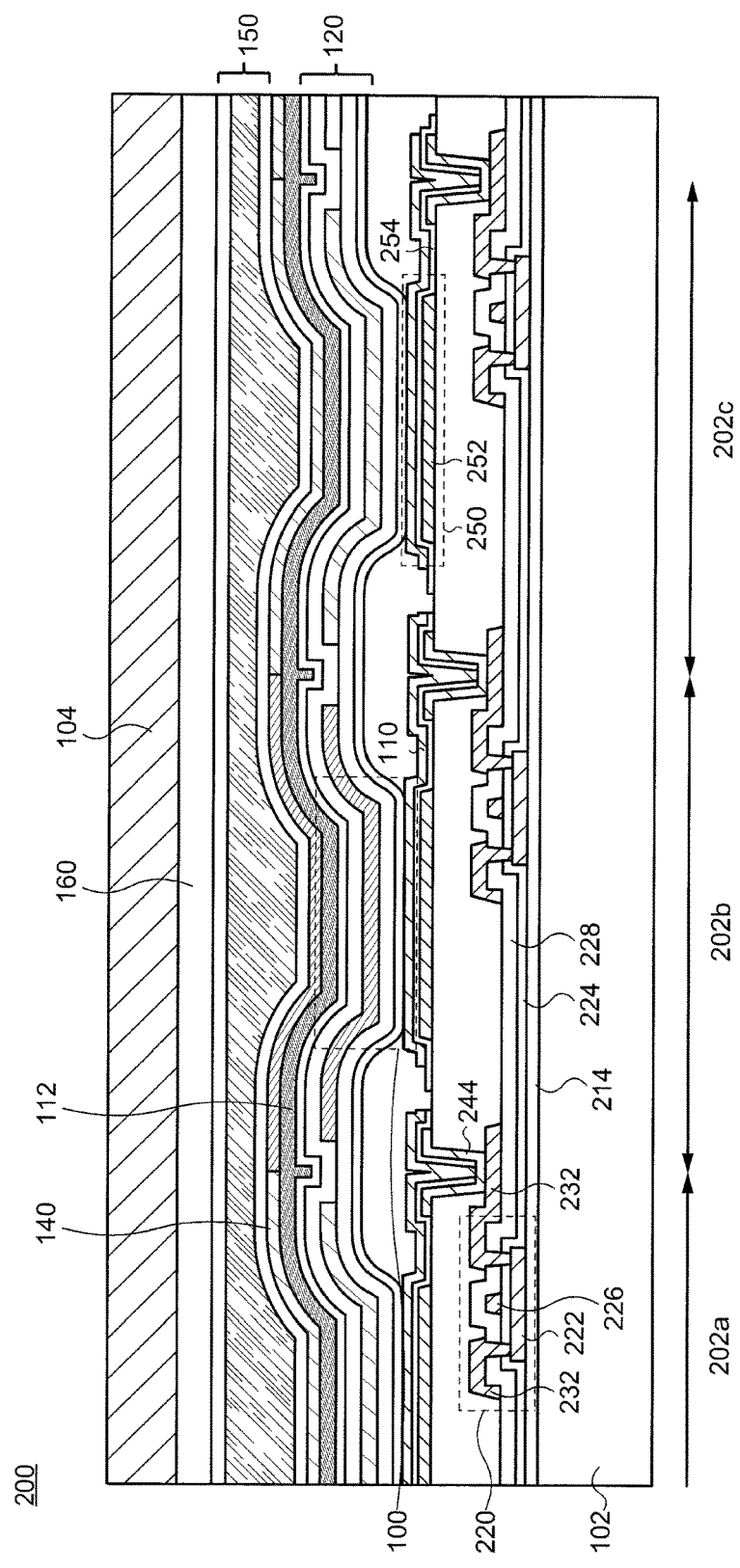
FIG. 10 is a schematic cross-sectional view of a display device according to an embodiment of the present invention.

FIG. 10 shows a schematic cross-sectional view of the display device 200 including three continuously arranged pixels 202a, 202b, and 202c. The pixels 202 including the plurality of pixels 202a, 202b, and 202c each possess, over the substrate 102, elements such as a transistor 220, the light-emitting element 100 electrically connected to the transistor 220, and a supplementary capacitor 250 through a base film 214. FIG. 10 shows an example in which one transistor 220 and one supplementary capacitor 250 are disposed in each pixel 202. However, each pixel 202 may have a plurality of transistors and a plurality of capacitor elements. The structure of the light-emitting element 100 is the same as that described in the First Embodiment. Hereinafter, the manufacturing method of the display device 200 is explained with reference to schematic cross-sectional views thereof.

1. Transistor

First, as shown in FIG. 11A, the base film 214 is formed over the substrate 102. The substrate 102 has a function to support semiconductor elements included in the display region 204, such as the transistor 220, the light-emitting element 100, and the like. Therefore, a material having heat resistance to a process temperature of a variety of elements formed thereover and chemical stability to chemicals used in the process may be used for the substrate 102. Specifically, the substrate 102 may include glass, quartz, plastics, a metal, ceramics, and the like.

When flexibility is provided to the display device 200, a base material is formed over the substrate 102. In this case, the substrate 102 may be called a supporting substrate. The base material is an insulating film with flexibility and may include a material selected from a polymer material exemplified by a polyimide, a polyamide, a polyester, and a polycarbonate. The base material can be formed by applying a wet-type film-forming method such as a printing method, an ink-jet method, a spin-coating method, and a dip-coating method or a lamination method.

The base film 214 is a film having a function to prevent impurities such as an alkaline metal from diffusing to the transistor 220 and the like from the substrate 102 (and the base material) and may include an inorganic insulator such as silicon nitride, silicon oxide, silicon nitride oxide, and silicon oxynitride. The base film 214 can be formed to have a single-layer or stacked-layer structure by applying a chemical vapor deposition method (CVD method), a sputtering method, or the like. When an impurity concentration in the substrate 102 is low, the base film 214 may not be provided or may be formed to cover a part of the substrate 102.

Next, a semiconductor film 222 is formed (FIG. 11A). The semiconductor film 222 may contain Group 14 elements such as silicon. Alternatively, the semiconductor film 222 may include an oxide semiconductor. As an oxide semiconductor, Group 13 elements such as indium and gallium are represented. For example, a mixed oxide of indium and gallium (IGO) may be used. When an oxide semiconductor is used, the semiconductor film 222 may further contain a Group 12 element, and a mixed oxide of indium, gallium, and zinc (IGZO) is exemplified. Crystallinity of the semiconductor film 222 is not limited, and the semiconductor film 222 may include a crystal state of a single crystalline, polycrystalline, microcrystalline, or amorphous state.

When the semiconductor film 222 includes silicon, the semiconductor film 222 may be prepared with a CVD method by using a silane gas and the like as a raw material. A heat treatment or application of light such as a laser may be performed on amorphous silicon obtained to conduct crystallization. When the semiconductor film 222 includes an oxide semiconductor, the semiconductor film 222 can be formed by utilizing a sputtering method and the like.

Next, a gate insulating film 224 is prepared so as to cover the semiconductor film 222 (FIG. 11A). The gate insulating film 224 can also be prepared with an inorganic compound containing silicon, such as silicon oxide and silicon nitride, by using the method the same as the base film 214. The gate insulating film 224 may have a single-layer structure or a stacked-layer structure.

Next, a gate electrode 226 is formed over the gate insulating film 224 with a sputtering method or a CVD method (FIG. 11B). The gate electrode 226 may be formed with a metal such as titanium, aluminum, copper, molybdenum, tungsten, tantalum or an alloy thereof so as to have a single-layer or stacked-layer structure. For example, a structure in which a highly conductive metal such as aluminum and copper is sandwiched by a metal with a relatively high melting point, such as titanium, tungsten, and molybdenum, can be employed.

Next, an interlayer film 228 is formed over the gate electrode 226 (FIG. 11B). The interlayer film 228 may have a single-layer or stacked layer structure, may include an inorganic insulator such as silicon nitride, silicon oxide, silicon nitride oxide, and silicon oxynitride, and may be prepared with the same method as that of the base film 214. When the interlayer film 228 has a stacked structure, a layer including an inorganic compound may be stacked after forming a layer including an organic compound, for example. After that, doping may be conducted on the semiconductor film 222 to form source/drain regions.

Next, etching is performed on the interlayer film 228 and the gate insulating film 224 to form openings 230 reaching the semiconductor film 222 (FIG. 11C). The openings 230 can be prepared, for example, by conducting plasma etching in a gas including a fluorine-containing hydrocarbon.

Figure 12A:
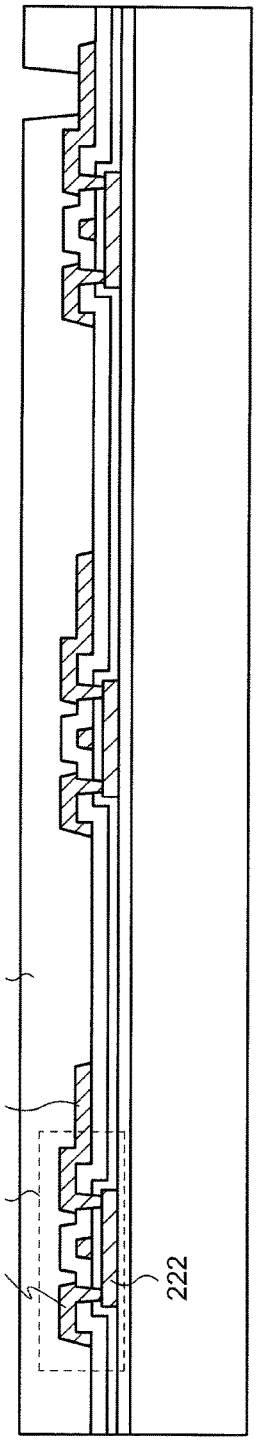
FIG. 12A to FIG. 12C are schematic cross-sectional views for explaining a manufacturing method of a display device according to an embodiment of the present invention.

Next, a metal film is formed to cover the openings 230 and processed with etching to form source/drain electrodes 232 (FIG. 12A). Similar to the gate electrode 226, the metal film may include a variety of metals and have a single-layer or stacked layer structure. The metal film can be formed with a method similar to that of the gate electrode 226. Through the aforementioned processes, the transistor 220 is fabricated. In the present embodiment, the transistor 220 is illustrated as a top-gate type transistor. However, there is no limitation to the structure of the transistor 220, and the transistor 220 may be a bottom-gate type transistor, a multi-gate type transistor having a plurality of gate electrodes 226, or a dual-gate type transistor having a structure in which the semiconductor film 222 is sandwiched by two gate electrodes 226. Moreover, there is no limitation to a vertical relationship between the source/drain electrodes 232 and the semiconductor film 222.

2. Supplementary Capacitor and Light-Emitting Element

Next, a leveling film 240 is formed so as to cover the transistor 220 (FIG. 12A). The leveling film 240 has a function to absorb depressions, projections, and inclinations caused by the transistor 220 and the like and provide a flat surface. The leveling film 240 can be prepared with an organic insulator. As an organic insulator, a polymer material such as an epoxy resin, an acrylic resin, a polyimide, a polyamide, a polyester, a polycarbonate, and a polysiloxane is represented. The leveling film 240 can be formed with the aforementioned wet-type film-forming method and the like.

Figure 12B:
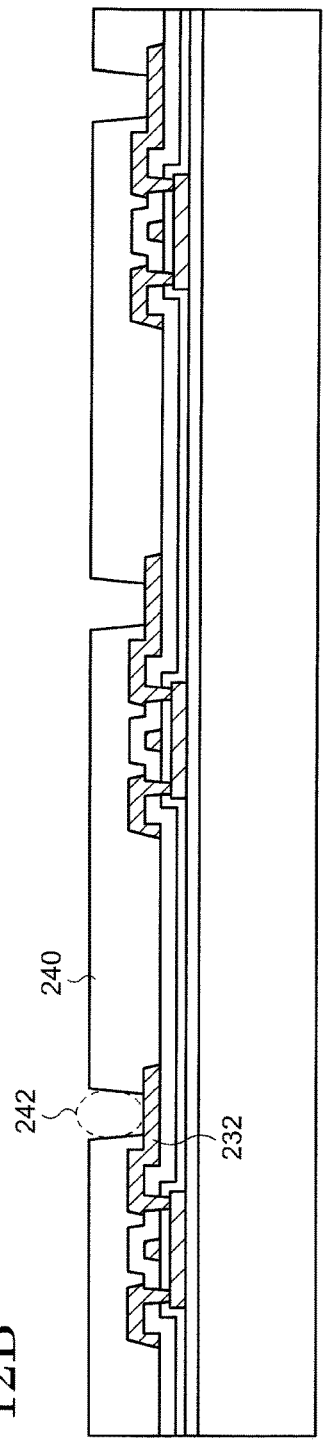
Figure 12C:
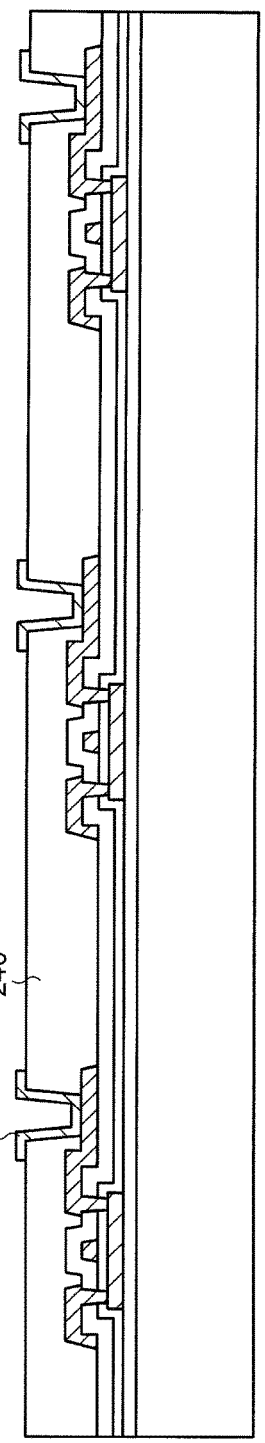

After that, etching is performed on the leveling film 240 to form an opening 242 exposing one of the source/drain electrodes 232 (FIG. 12B). After that, a connection electrode 244 is prepared so as to cover this opening 242 and be in contact with one of the source/drain electrodes 232 of the transistor 220 (FIG. 12C). The connection electrode 244 may be formed by using a conductive oxide transmitting visible light, such as indium-tin oxide (ITO) and indium-zinc oxide (IZO), with a sputtering method or the like. Note that formation of the connection electrode 244 is optional. Deterioration of a surface of the source/drain electrode 232 can be avoided in the following processes by forming the connection electrode 244, by which generation of contact resistance between the source/drain electrode 232 and the first electrode 110 can be suppressed.

Figure 13A:
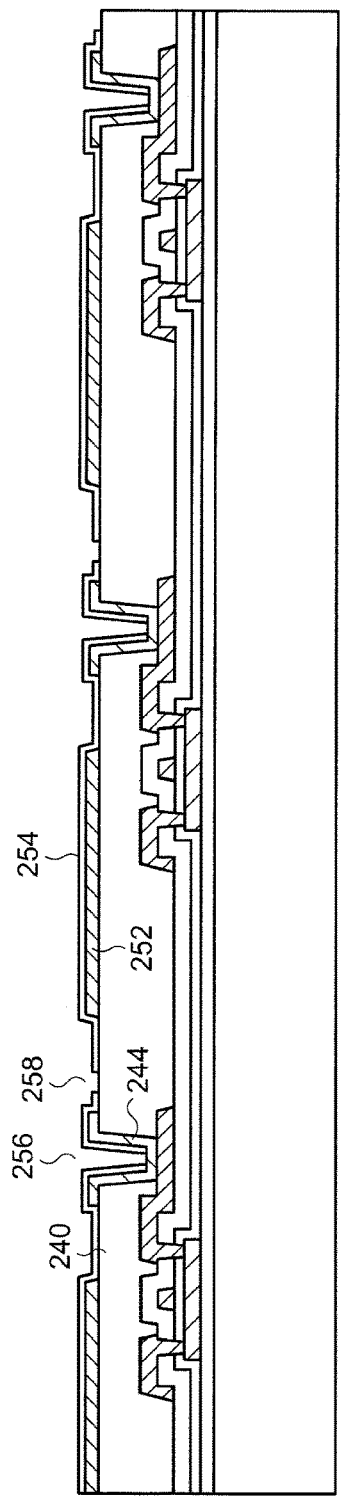
FIG. 13A and FIG. 13B are schematic cross-sectional views for explaining a manufacturing method of a display device according to an embodiment of the present invention.

Next, a metal film is formed over the leveling film 240 and processed with etching to form one of the electrodes 252 of the supplementary capacitor 250 (FIG. 13A). Similar to the conductive film used for the formation of the source/drain electrodes 232, the metal film used here may have a single layer structure or a stacked layer structure, and a three-layer structure of molybdenum/aluminum/molybdenum may be employed, for example.

Next, an insulating film 254 is formed over the leveling film 240 and the electrode 252 (FIG. 13A). The insulating film 254 not only functions as a protection film for the transistor 220 but also serves as a dielectric in the supplementary capacitor 250. Therefore, it is preferred to use a material with relatively high permittivity. For example, the insulating film 254 can be formed with silicon nitride, silicon nitride oxide, silicon oxynitride, or the like by applying a CVD method or a sputtering method. Openings 256 and 258 are provided in the insulating film 254 (FIG. 13A). The former is provided for electrical connection between the first electrode 110 formed later and the connection electrode 244. The latter is an opening to abstract, through the partition wall 114, water and gas eliminated from the leveling film 240 in a heating process and the like performed after the formation of the partition wall 114.

Figure 13B:
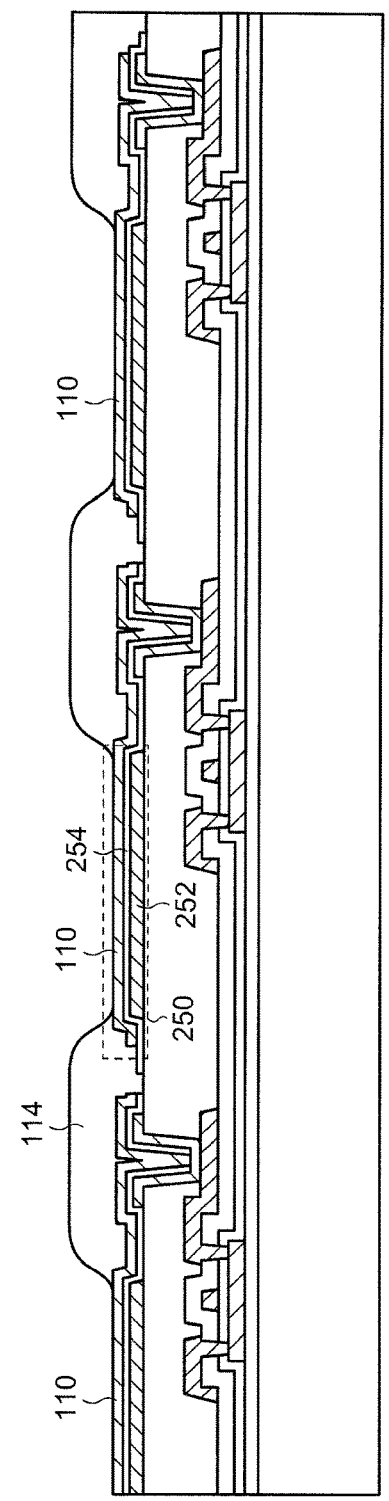

Next, as shown in FIG. 13B, the first electrode 110 is prepared so as to cover the opening 256. The supplementary capacitor 250 is formed by the first electrode 110, the insulating film 254, and the electrode 252. A potential of the gate electrode 226 of the transistor 220 can be maintained for a longer time by forming the supplementary capacitor 250.

The structure of the first electrode 110 is the same as that described in the First Embodiment, and the first electrode 110 can be formed by using a sputtering method, a CVD method, or the like.

Next, the partition wall 114 is formed so as to cover an edge portion of the first electrode 110 (FIG. 13B). The formation of the partition wall 114 allows steps caused by the first electrode 110 and the like to be absorbed and first electrodes 110 of the adjacent pixels 202 to be electrically insulated from each other. The partition wall 114 may be prepared with a wet-type film-forming method by using an epoxy resin, an acrylic resin, or the like.

Figure 14A:
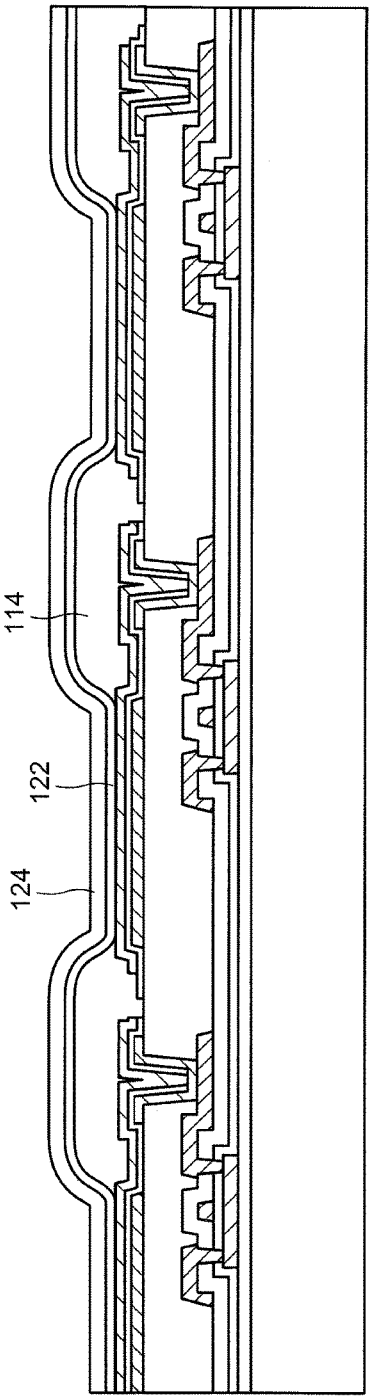
FIG. 14A and FIG. 14B are schematic cross-sectional views for explaining a manufacturing method of a display device according to an embodiment of the present invention.

Next, the EL layer 120 and the second electrode 112 of the light-emitting element 100 are formed so as to cover the first electrode 110 and the partition wall 114. The structures of these elements are the same as those described in the First Embodiment. Specifically, the hole-injection layer 122 is first formed to cover the first electrode 110 and the partition wall 114, and then the hole-transporting layer 124 is prepared over the hole-injection layer 122 (FIG. 14A). As described above, the hole-injection layer 122 and the hole-transporting layer 124 each may have a single-layer structure or a stacked-layer structure. For example, when the thickness of the hole-transporting layer 124 is changed in every pixel 202 as shown in FIG. 2A, the hole-transporting layer 124 in which a plurality of compounds is stacked may be used in the pixel 202c having the hole-transporting layer 124 with a large thickness, while the hole-transporting layer 124 may have a single-layer structure in the pixel 202 having the hole-transporting layer 124 with a small thickness.

Figure 14B:
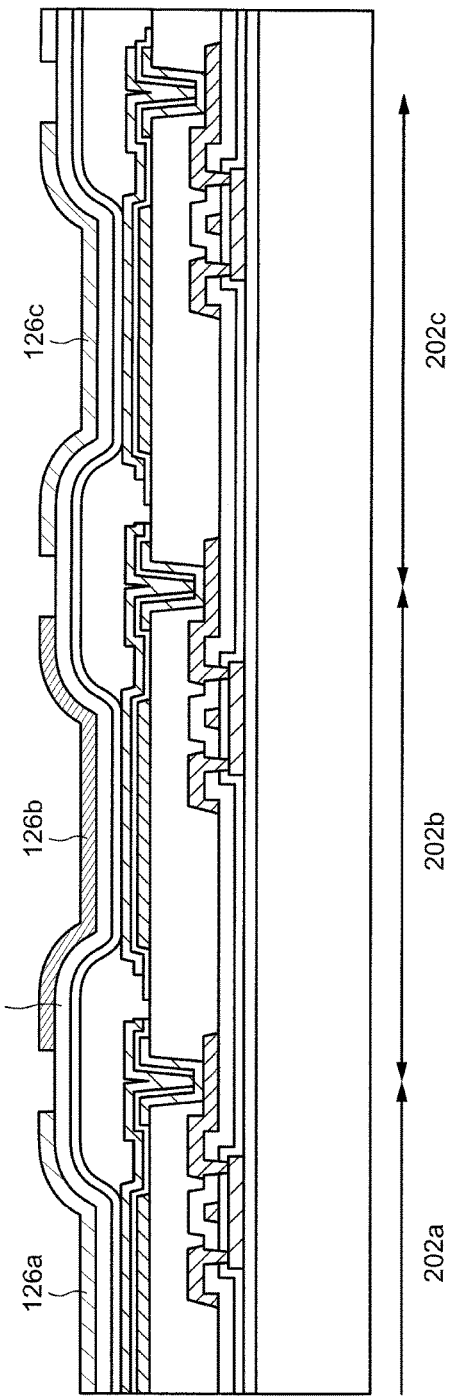

Next, the emission layer 126 is formed over the hole-transporting layer 124 (FIG. 14B). In the present embodiment, the emission layers 126a, 126b, and 126c which are different in structure or include different materials between the continuous pixels 202a, 202b, and 202c are fabricated. In this case, materials to be included in the respective emission layers 126a, 126b, and 126c are respectively deposited in the pixels 202a, 202b, and 202c by using metal masks. Alternatively, the emission layers 126a, 126b, and 126c may be formed with an ink-jet method.

Figure 15A:
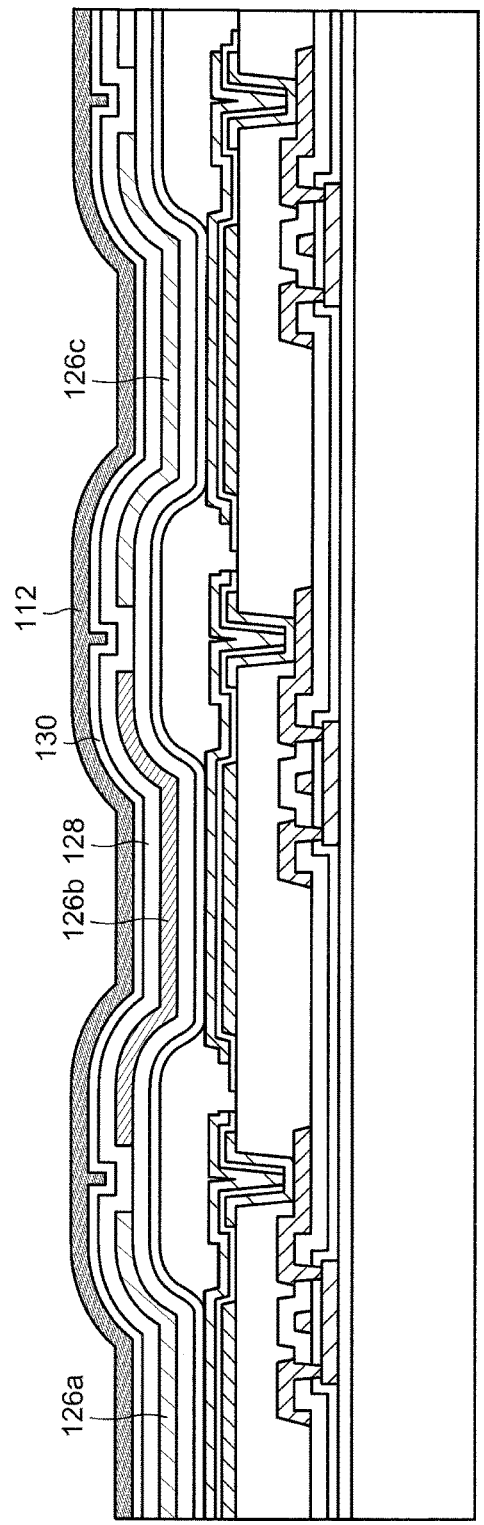
FIG. 15A and FIG. 15B are schematic cross-sectional views for explaining a manufacturing method of a display device according to an embodiment of the present invention.

The electron-transporting layer 128 and the electron-injection layer 130 are successively formed over the emission layer 126, and the second electrode 112 is fabricated over the electron-injection layer 130 (FIG. 15A). Each layer structuring the EL layer 120 may be formed by applying a wet-type film-forming method or a dry-type film-forming method such as an evaporation method. The second electrode 112 is also prepared by using a sputtering method or an evaporation method. Through these processes, the supplementary capacitor 250 and the light-emitting element 100 are fabricated.

3. Optical Adjustment Layer

Figure 15B:
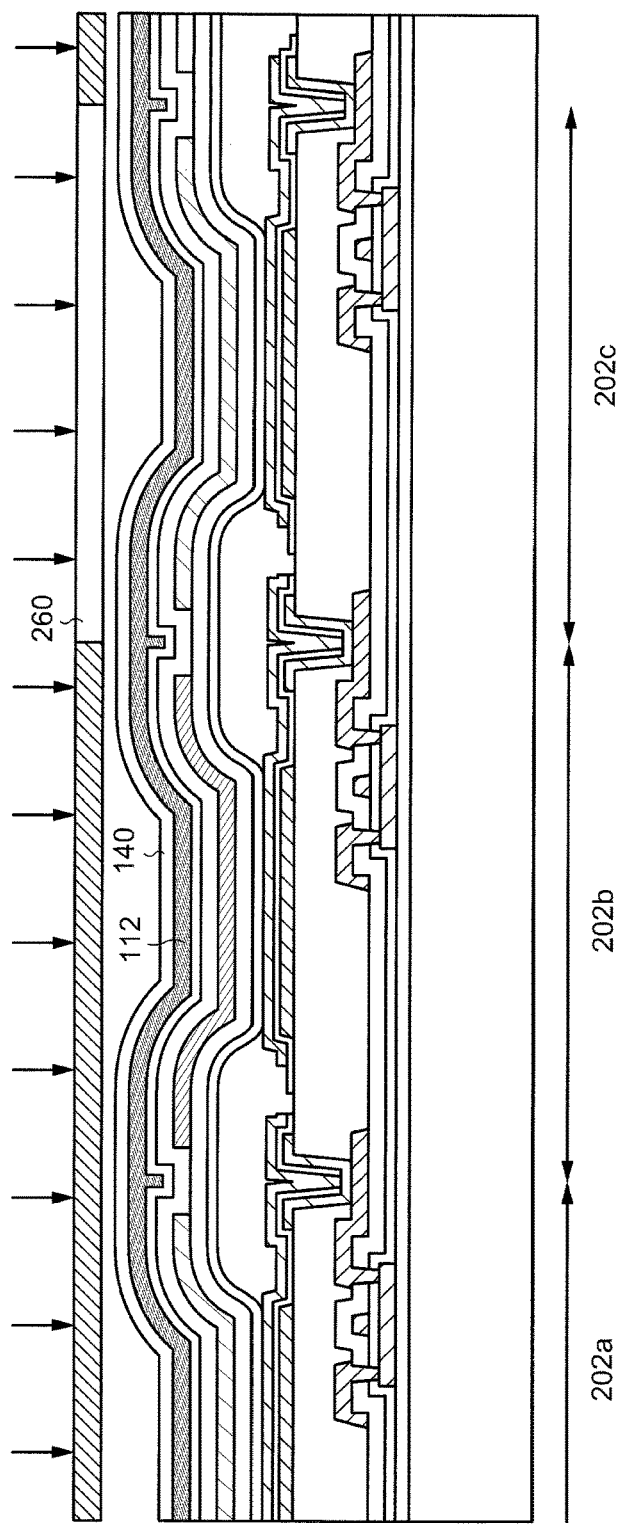

Next, the optical adjustment layer 140 is formed over the second electrode 112 (FIG. 15B). The optical adjustment layer 140 may be formed with a wet-type film-forming method or a dry-type film-forming method. Alternatively, an epitaxial growth method or an atomic layer deposition (ALD) method may be applied. At this time, the optical adjustment layer 140 may be formed across the plurality of pixels 202. In other words, the optical adjustment layer 140 may not be individually prepared in every pixel 202 but may be prepared so as to be shared by the plurality of pixels 202. Therefore, the thickness of the optical adjustment layer 140 can be the same or substantially the same over the plurality of pixels 202. If necessary, a plurality of optical adjustment layers 140 may be stacked.

After that, a photomask 260 is arranged over the optical adjustment layer 140. The photomask 260 has a light-transmitting portion at a position corresponding to the pixel on which light irradiation is carried out and has a non-light transmitting portion in other regions. In the example shown in FIG. 15B, the refractive index of the optical adjustment layer 140 is changed the most in the pixel 202c. Hence, the photomask 260 is arranged so that the pixel 202c overlaps with the light-transmitting portion. After that, light with a wavelength corresponding to the absorption wavelength of the photorefractive material included in the optical adjustment layer 140 is applied (first irradiation). With this procedure, the light-irradiated region, that is, the photorefractive material and the optical adjustment layer 140 in the pixel 202c are capable of having a refractive index different from that in other regions (FIG. 16).

Figure 16:
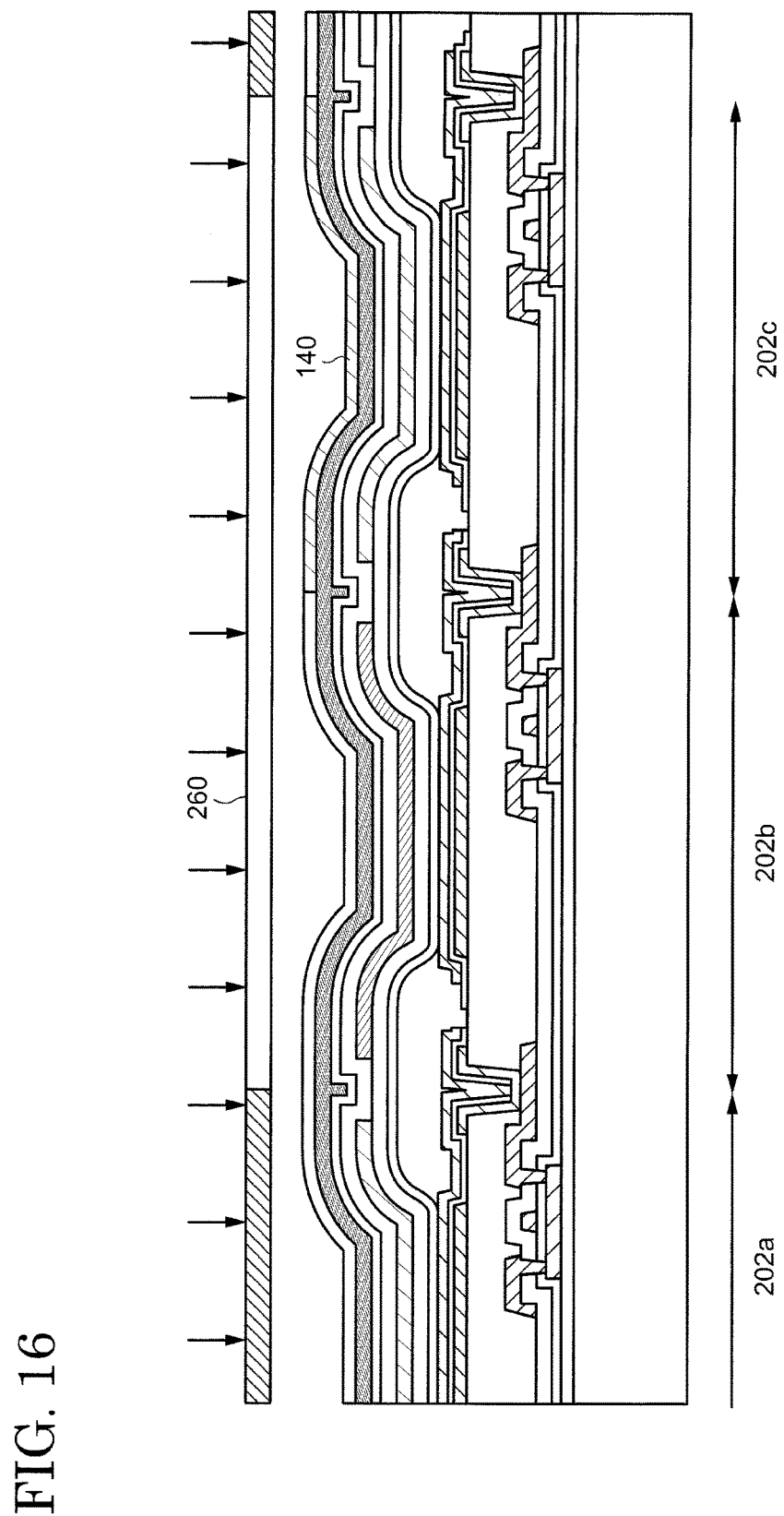
FIG. 16 is a schematic cross-sectional view for explaining a manufacturing method of a display device according to an embodiment of the present invention.

Next, as shown in FIG. 16, a photomask 260 having a light-transmitting portion at a position corresponding to the pixels (pixels 202c and 202b in FIG. 16) is arranged. After that, a second irradiation is performed. With this procedure, the optical adjustment layer 140 in the pixel 202c is light-irradiated twice, while the light irradiation is conducted once in the pixel 202b. Therefore, the refractive index of the optical adjustment layer 140 can be different between the pixels 202b and 202c (FIG. 17).

Figure 17:
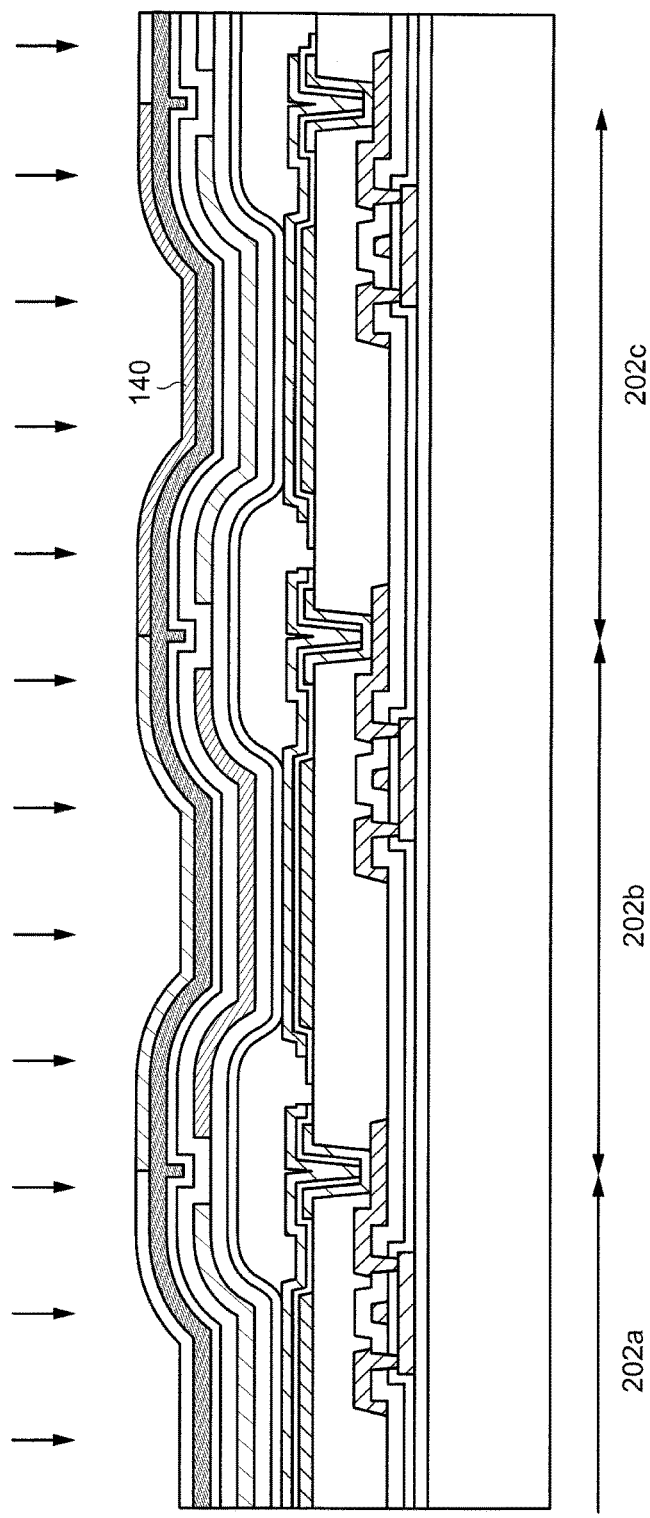
FIG. 17 is a schematic cross-sectional view for explaining a manufacturing method of a display device according to an embodiment of the present invention.
Figure 18:
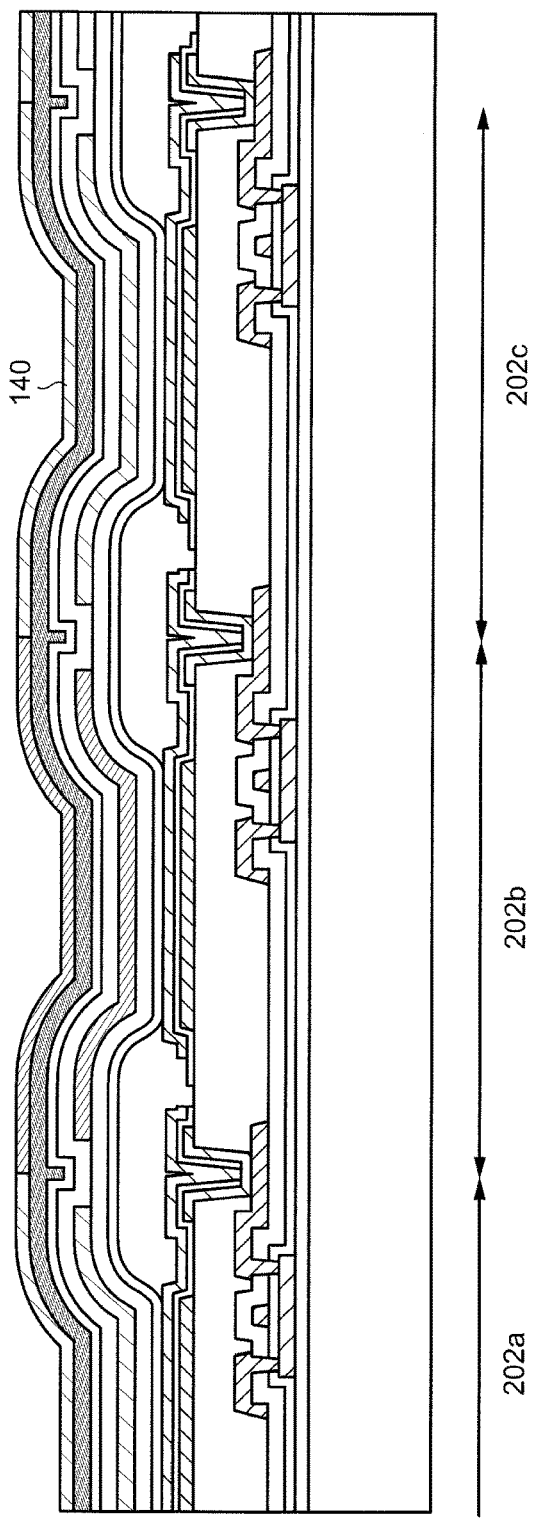
FIG. 18 is a schematic cross-sectional view for explaining a manufacturing method of a display device according to an embodiment of the present invention.

Next, a third irradiation is conducted (FIG. 17). Here, the optical adjustment layer 140 in the pixels 202a, 202b, and 202c is light-irradiated. Therefore, the photomask 260 may not be arranged. With this procedure, the optical adjustment layer 140 is light-irradiated three times in the pixel 202c, twice in the pixel 202b, and once in the pixel 202a. When the same photoenergy is assumed to be provided in every light-irradiation, the refraction index is changed the most in the optical adjustment layer 140 in the pixel 202c, while the change in refraction index is the smallest in the optical adjustment layer 140 in the pixel 202a (FIG. 18). The light-irradiation with the photomask 260 in such a manner enables it to control the refraction index of the optical adjustment layer 140 without individually depositing the optical adjustment layer 140 in each of the pixels 202.

4. Passivation Film and Other Structures

Figure 19:
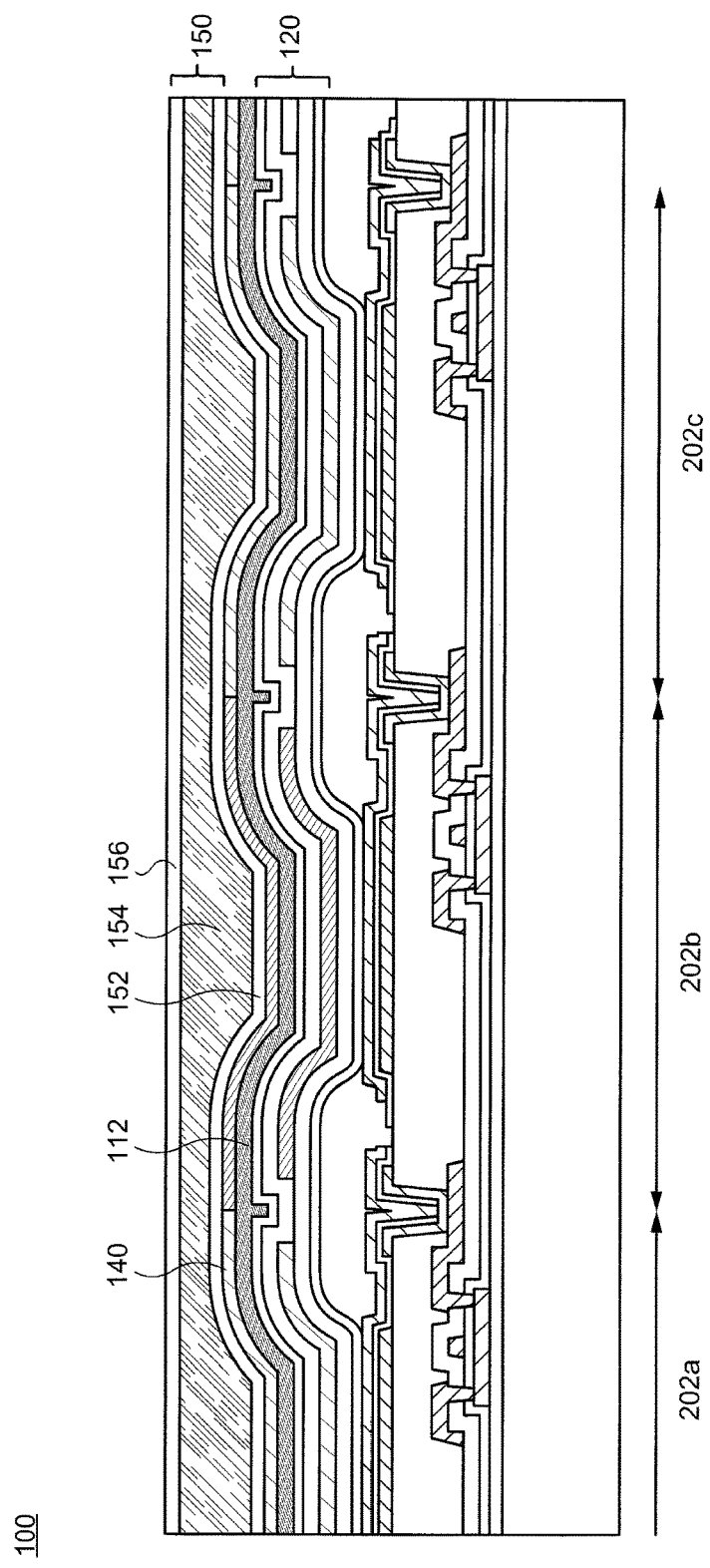
FIG. 19 is a schematic cross-sectional view for explaining a manufacturing method of a display device according to an embodiment of the present invention.

After forming the optical adjustment layer 140, the passivation film 150 is prepared. Specifically, as shown in FIG. 19, the first layer 152 is first formed over the optical adjustment layer 140. The first layer 152 may include an inorganic material such as silicon nitride, silicon oxide, silicon nitride oxide, and silicon oxynitride and may be prepared with a method similar to that of the base film 214.

Next, the second layer 154 is formed. The second layer 154 may contain an organic resin including an acrylic resin, a polysiloxane, a polyimide, a polyester, and the like. Furthermore, as shown in FIG. 19, the second layer 154 may be formed at a thickness so that depressions and projections caused by the partition wall 114 are absorbed and a flat surface is provided. The second layer 154 may be formed by a wet-type film-forming method such as an ink-jet method. Alternatively, the second layer 154 may be prepared by atomizing or vaporizing oligomers serving as a raw material of the aforementioned polymer material at a reduced pressure, spraying the first layer 152 with the oligomers, and then polymerizing the oligomers.

After that, the third layer 156 is formed. The third layer 156 may have the same structure as the first layer 152 and can be formed with the same method as that of the first layer 152.

After that, the opposing substrate 104 is fixed through the filler 160 (FIG. 10). The filler 160 may contain a polymer material such as a polyester, an epoxy resin, and an acrylic resin and may be formed by applying a printing method, a lamination method or the like. A desiccant may be included in the filler 160. The opposing substrate 104 may include the same material as the substrate 102. When flexibility is provided to the display device 200, a polymer material such as a polyolefin and a polyimide can be applied for the opposing substrate 104 in addition to the aforementioned polymer materials. In this case, the base material is formed over the substrate 102 as described above, and then the elements such as the transistor 220 and the light-emitting element 100 are fabricated. After that, an interface between the substrate 102 and the base material is irradiated with light such as a laser to reduce adhesion between the substrate 102 and the base material, and then the substrate 102 is physically peeled off, leading to the formation of the flexible display device 200.

Although not shown, a polarizing plate (circular polarizing plate) may be formed without using the opposing substrate 104 as described above. Alternatively, a polarizing plate may be arranged over or under the opposing substrate 104.

Note that the opposing substrate 104 may be fixed over the substrate 102 by using the sealer 106 without fabricating the passivation film 150 (see FIG. 1A and FIG. 1B). In this case, the space formed by the substrate 102, the opposing substrate 104, and the sealer 106 may be filled with an inert gas such as nitrogen and argon. Moreover, a desiccant may be added to this space. With this structure, the optical adjustment layer 140 can be in contact with the layer of an inert gas.

As described above, the optical adjustment layer 140 can be continuously formed through the plurality of pixels 202, and control of the refractive index of the optical adjustment layer 140 in each pixel 202 can be conducted by light-irradiation with the use of a photomask. When an optical adjustment layer is provided to an electrode in order to adjust a resonance structure of a light-emitting element, it is usually necessary to arrange the optical adjustment layers pixel-by-pixel with different processes because the resonance structure is different between the pixels. Therefore, a process load is increased. Particularly, when resolution of a display device is high and a pixel size is small, it is not always easy to form, pixel-by-pixel, the optical adjustment layers with a different thickness.

However, in an embodiment of the present invention, the optical film-thickness of the optical adjustment layer 140 is controlled, pixel-by-pixel, with light irradiation using a photomask. The use of a photomask allows light irradiation to be performed at a high positional accuracy, which enables it to precisely irradiate the optical adjustment layer 140 at the position corresponding to each pixel 202. Hence, the refractive index of the optical adjustment layer 140 can be precisely controlled in every pixel even in the case of a high-resolution display, by which a display device capable of reproducing a high-quality image can be produced at low cost.

The aforementioned modes described as the embodiments of the present invention can be implemented by appropriately combining with each other as long as no contradiction is caused. Furthermore, any mode which is realized by persons ordinarily skilled in the art through the appropriate addition, deletion, or design change of elements or through the addition, deletion, or condition change of a process is included in the scope of the present invention as long as they possess the concept of the present invention.

In the specification, although the cases of the organic EL display device are exemplified, the embodiments can be applied to any kind of display devices of the flat panel type such as other self-emission type display devices, liquid crystal display devices, and electronic paper type display device having electrophoretic elements and the like. In addition, it is apparent that the size of the display device is not limited, and the embodiment can be applied to display devices having any size from medium to large.

It is properly understood that another effect different from that provided by the modes of the aforementioned embodiments is achieved by the present invention if the effect is obvious from the description in the specification or readily conceived by persons ordinarily skilled in the art.

What is claimed is:

1. A display device comprising:
    a substrate; and
    a first light-emitting element and a second light-emitting element over the substrate and adjacent to each other, the first light-emitting element and the second light-emitting element each comprising:
        a first electrode;
        an EL layer over the first electrode;
        a second electrode over the EL layer; and
        an optical adjustment layer over the second electrode, the optical adjustment layer including a first material,
    wherein the optical adjustment layer over the first light-emitting element and the optical adjustment layer over the second light-emitting element are arranged to be continuously integrated,
    the optical adjustment layer over the first light-emitting element is different in refraction index from the optical adjustment layer over the second light-emitting element,
    the first material is the same in composition between the first light-emitting element and the second light-emitting element, and
    the first material varies in refraction index upon light-irradiation reversibly or irreversibly.

2. The display device according to claim 1, wherein the first material is different in refraction index between the first light-emitting element and the second light-emitting element.

3. The display device according to claim 1, wherein the first material is different in chemical structure between the first light-emitting element and the second light-emitting element.

4. The display device according to claim 1, wherein the first material is different in phase structure between the first light-emitting element and the second light-emitting element.

5. The display device according to claim 1, wherein the optical adjustment layer is the same in thickness between the first light-emitting element and the second light-emitting element.

6. The display device according to claim 1, further comprising a second substrate over the optical adjustment layer, wherein the optical adjustment layer is exposed to a space between the optical adjustment layer and the second substrate.

7. The display device according to claim 1, further comprising a passivation film over and in contact with the optical adjustment layer, the passivation film covering the first light-emitting element and the second light-emitting element.

8. The display device according to claim 1, wherein the optical adjustment layer over the first light-emitting element is in contact with the inorganic layer, and the optical adjustment layer over the second light-emitting element is in contact with the inorganic layer.

9. A display device comprising:
    a substrate; and
    a first light-emitting element and a second light-emitting element over the substrate and adjacent to each other, the first light-emitting element and the second light-emitting element each comprising:
        a first electrode;
        an EL layer over the first electrode;
        a second electrode over the EL layer;
        a first optical adjustment layer over the second electrode, the first optical adjustment layer including a first material, and
        a second optical adjustment layer over the first optical adjustment layer,
    wherein the first optical adjustment layer over the first light-emitting element and the first optical adjustment layer over the second light-emitting element are arranged to be continuously integrated,
    the first optical adjustment layer over the first light-emitting element is different in refraction index from the first optical adjustment layer over the second light-emitting element,
    the first material is the same in composition between the first light-emitting element and the second light-emitting element, and
    the second optical adjustment layer includes a second material varying in refraction index upon light-irradiation.

10. The display device according to claim 9, wherein the second material is different in refraction index between the first light-emitting element and the second light-emitting element.

11. A method for manufacturing a display device, the method comprising:
    forming a first electrode in each of a first pixel and a second pixel adjacent to each other;
    forming an EL layer over the first electrode of the first pixel and the first electrode of the second pixel;
    forming a second electrode over the EL layer; and
    forming an optical adjustment layer over the second electrode, the optical adjustment layer including a first material and being shared by the first pixel and the second pixel, wherein the optical adjustment layer is different in refraction index between the first pixel and the second pixel, the first material is the same in composition between the first light-emitting element and the second light-emitting element, and the first material varies in refraction index upon light irradiation.

12. The method according to claim 11, further comprising irradiating one of the first pixel and the second pixel with light.

13. The method according to claim 12, further comprising irradiating the other of the first pixel and the second pixel with light.

14. The method according to claim 12, further comprising irradiating both the first pixel and the second pixel with light.

* * * * *